(12) United States Patent
Ko et al.

(10) Patent No.: US 11,582,876 B2
(45) Date of Patent: Feb. 14, 2023

(54) FOLDABLE DISPLAY DEVICE INCLUDING HINGE SYSTEM

(71) Applicant: LG DISPLAY CO., LTD., Seoul (KR)

(72) Inventors: Dae-Hoon Ko, Paju-si (KR); Yong-Ik Hwang, Paju-si (KR); Bo-Ra Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/106,769

(22) Filed: Nov. 30, 2020

(65) Prior Publication Data
US 2021/0168952 A1    Jun. 3, 2021

(30) Foreign Application Priority Data

Dec. 2, 2019 (KR) .......................... 10-2019-0158066

(51) Int. Cl.
*H05K 5/02* (2006.01)
*H05K 5/00* (2006.01)

(52) U.S. Cl.
CPC ......... *H05K 5/0226* (2013.01); *H05K 5/0017* (2013.01)

(58) Field of Classification Search
CPC .... G06F 1/1641; G06F 1/1652; G06F 1/1681; G09F 9/301; H05K 5/0226
See application file for complete search history.

(56) References Cited

U.S. PATENT DOCUMENTS

| | | | |
|---|---|---|---|
| 9,179,559 B1 | 11/2015 | Kim et al. | |
| 10,032,391 B2 | 7/2018 | Kim et al. | |
| 10,043,421 B2 | 8/2018 | Koo et al. | |
| 10,401,917 B1* | 9/2019 | Dai | G06F 1/1681 |
| 10,694,623 B2 | 6/2020 | Park et al. | |
| 10,802,551 B1* | 10/2020 | Lin | G06F 1/1652 |

(Continued)

FOREIGN PATENT DOCUMENTS

| | | |
|---|---|---|
| CN | 103927940 A | 7/2014 |
| CN | 104900152 A | 9/2015 |

(Continued)

OTHER PUBLICATIONS

First Notification of Office Action dated Jun. 8, 2022, from the China National Intellectual Property Administration in counterpart Chinese application No. 202011318274.7. 16 pages including English translation.

*Primary Examiner* — Rockshana D Chowdhury
*Assistant Examiner* — Douglas R Burtner
(74) *Attorney, Agent, or Firm* — Morgan, Lewis & Bockius LLP

(57) ABSTRACT

A foldable display device includes a display panel including first and second display areas and a folding part between the first and second display areas; first and second system units disposed under the display panel and corresponding to the first and second display areas, respectively, an elastic plate between the display panel and the first and second system units; and a hinge system corresponding to the folding part and disposed on rear surfaces of the first and second system units, the hinge system including a first hinge portion on the rear surface of the first system unit and a second hinge portion on the rear surface of the second system unit, wherein the first and second hinge portions are rotatably hinge-combined with each other.

18 Claims, 18 Drawing Sheets

(56) References Cited

U.S. PATENT DOCUMENTS

| | | | |
|---|---|---|---|
| 10,890,951 B1* | 1/2021 | Watamura | E05D 11/0054 |
| 10,963,012 B2 | 3/2021 | Shin et al. | |
| 11,048,302 B2 | 6/2021 | Seo et al. | |
| 11,268,565 B2* | 3/2022 | Bae | G06F 1/1652 |
| 2010/0277665 A1 | 11/2010 | Kuo et al. | |
| 2013/0021762 A1* | 1/2013 | van Dijk | H04M 1/022 |
| | | | 361/749 |
| 2014/0196254 A1 | 7/2014 | Song et al. | |
| 2015/0255023 A1 | 9/2015 | Lee et al. | |
| 2015/0330614 A1* | 11/2015 | Lee | B65D 85/38 |
| | | | 206/45.23 |
| 2015/0366089 A1* | 12/2015 | Park | H04M 1/022 |
| | | | 361/679.01 |
| 2016/0091923 A1* | 3/2016 | Morrison | G06F 1/1681 |
| | | | 345/55 |
| 2017/0025634 A1 | 1/2017 | Jeong | |
| 2017/0068275 A1* | 3/2017 | Lee | G06F 1/1616 |
| 2017/0141173 A1 | 5/2017 | Choi et al. | |
| 2017/0142847 A1* | 5/2017 | Park | G06F 1/1681 |
| 2019/0204879 A1* | 7/2019 | Park | G06F 1/1681 |
| 2019/0354138 A1* | 11/2019 | Araki | G06F 1/1616 |
| 2020/0163239 A1* | 5/2020 | Yun | H04M 1/0268 |
| 2020/0315047 A1* | 10/2020 | Kang | G06F 1/1681 |
| 2020/0352044 A1* | 11/2020 | Hsu | H05K 5/0247 |
| 2021/0011513 A1* | 1/2021 | Watamura | G06F 1/1652 |
| 2021/0034117 A1* | 2/2021 | Torres | G06F 1/1616 |
| 2021/0120687 A1* | 4/2021 | Kim | G06F 1/1681 |
| 2021/0120688 A1* | 4/2021 | Wang | G06F 1/1652 |
| 2021/0343974 A1* | 11/2021 | Zhang | H01L 51/5237 |
| 2021/0356990 A1* | 11/2021 | Cha | G06F 1/1681 |
| 2021/0368032 A1* | 11/2021 | Liao | H04M 1/022 |
| 2022/0019266 A1* | 1/2022 | Park | G06F 1/1616 |
| 2022/0043481 A1* | 2/2022 | Shin | G06F 3/0412 |
| 2022/0083102 A1* | 3/2022 | Nishioka | G06F 1/1652 |
| 2022/0174830 A1* | 6/2022 | Li | G06F 1/1681 |

FOREIGN PATENT DOCUMENTS

| | | |
|---|---|---|
| CN | 105096756 A | 11/2015 |
| CN | 105659187 A | 6/2016 |
| CN | 105810104 A | 7/2016 |
| CN | I05788458 A | 7/2016 |
| CN | 106373490 A | 2/2017 |
| CN | 106462185 A | 2/2017 |
| CN | 106486018 A | 3/2017 |
| CN | 106710447 A | 5/2017 |
| CN | 109272872 A | 1/2019 |
| CN | 109523915 A | 3/2019 |
| CN | 208595386 U | 3/2019 |
| KR | 10-1861077 B1 | 6/2018 |
| KR | 10-2019-0080995 A | 7/2019 |

* cited by examiner

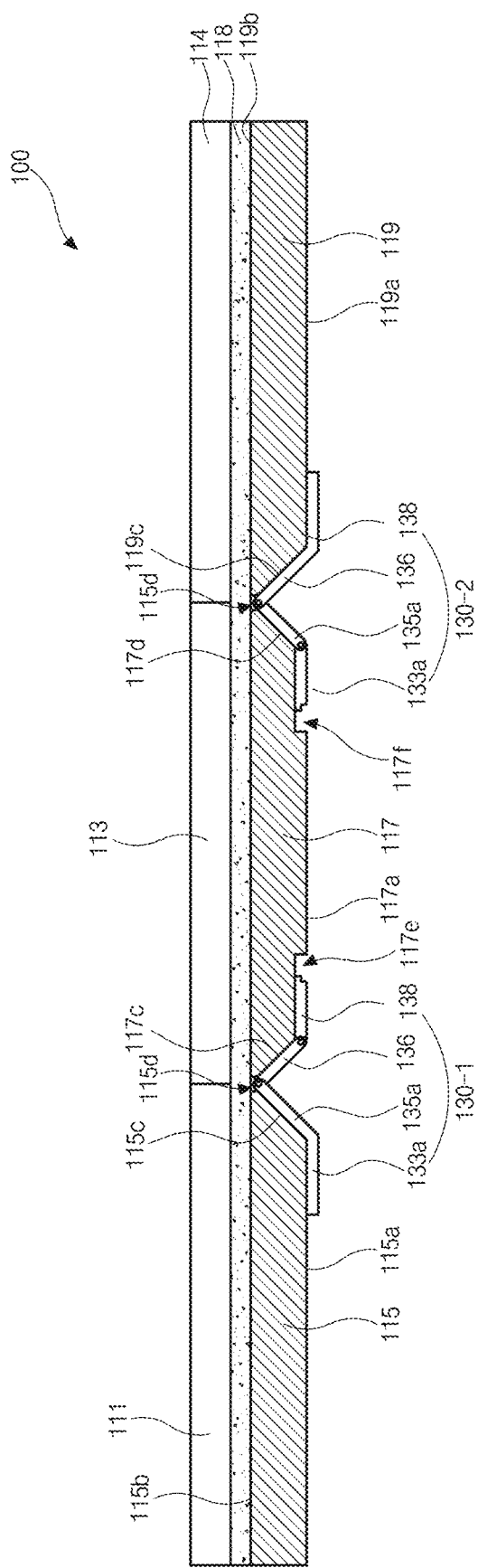

FOLDABLE DISPLAY DEVICE INCLUDING HINGE SYSTEM

CROSS-REFERENCE TO RELATED APPLICATION

The present application claims priority from and the benefit under 35 U.S.C § 119(a) of Korean Patent Application No. 10-2019-0158066 filed in the Republic of Korea on Dec. 2, 2019, which is hereby incorporated by reference in its entirety.

BACKGROUND

Technical Field

The present disclosure relates to a foldable display device, and more particularly, a foldable display device capable of being lightweight and thin profile and having improved durability.

Discussion of the Related Art

Recently, with entering into a full-fledged information age, there is a growing interest in information display dealing with and displaying mass information. In response to this, various flat panel display devices have been developed and have been in the spotlight.

Specific examples of the flat panel display devices include liquid crystal display (LCD) devices, plasma display panel (PDP) devices, field emission display (FED) devices, electroluminescence display (ELD) devices, organic light emitting diode display (OLED) devices. The flat panel display devices show excellent performance of thin thickness, light weight, and low power consumption and have rapidly replaced cathode ray tube (CRT).

However, since the flat panel display devices use a glass substrate to withstand high heat generated during a manufacturing process, there is a limit in providing light weight, thin thickness and flexibility.

Accordingly, a flexible display device is emerging as a next-generation display device, which is manufactured by using a flexible material such as plastic instead of a glass substrate without flexibility to maintain display performance even if it is bent like a paper.

The flexible display device uses a plastic thin film transistor substrate rather than glass. The flexible display device may be classified into an unbreakable display device having high durability, a bendable display device capable of being bent without break, a rollable display device capable of being rolled, and a foldable display device capable of being folded. The flexible display device may have advantages of space utilization, interior and design and may have various applications.

In particular, recently, a bendable or foldable display device, which is potable in a folding state and displays an image in an unfolding state, has been actively researched so as to realize the large area as well as ultrathin thickness, light weight and small size.

The bendable or foldable display device may be applied to various fields such as TVs, monitors, etc. as well as mobile devices such as mobile phones, ultra-mobile PCs, e-books, or electronic newspapers.

Meanwhile, the bendable or foldable display device (hereinafter, referred to as a foldable display device) requires various components such as a display panel for displaying an image, a mechanism for folding or unfolding the display panel, and a mechanism for elastically plating the display panel such that the display panel is maintained in a folding state or in an unfolding state.

Accordingly, it is difficult to implement the recently required lightweight and thin foldable display device, and there is a problem that the folded display panel is very vulnerable to external impacts, so that a foldable display device needs to be researched to solve the problems.

SUMMARY

Accordingly, embodiments of the present disclosure are directed to a foldable display device that substantially obviates one or more of the problems due to limitations and disadvantages of the related art.

An aspect of the present disclosure is to provide a foldable display device that can be easily folded and unfolded while having a light weight and a thin profile.

Another aspect of the present disclosure is to provide a foldable display device with the improved durability.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a foldable display device comprises a display panel including first and second display areas and a folding part between the first and second display areas; first and second system units disposed under the display panel and corresponding to the first and second display areas, respectively, an elastic plate between the display panel and the first and second system units; and a hinge system corresponding to the folding part and disposed on rear surfaces of the first and second system units, the hinge system including a first hinge portion on the rear surface of the first system unit and a second hinge portion on the rear surface of the second system unit, wherein the first and second hinge portions are rotatably hinge-combined with each other.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the present disclosure and which are incorporated in and constitute a part of this application, illustrate embodiments of the disclosure and together with the description serve to explain various principles of the present disclosure. In the drawings:

FIGS. 7A to 7E are cross-sectional views schematically illustrating the operation of the foldable display device in the folding state and the unfolding state in accordance with the operation of the hinge system according to the second embodiment of the present disclosure.

DETAILED DESCRIPTION

Reference will now be made in detail to embodiments of the disclosure, examples of which are illustrated in the accompanying drawings.

First Embodiment

Figure 1A:
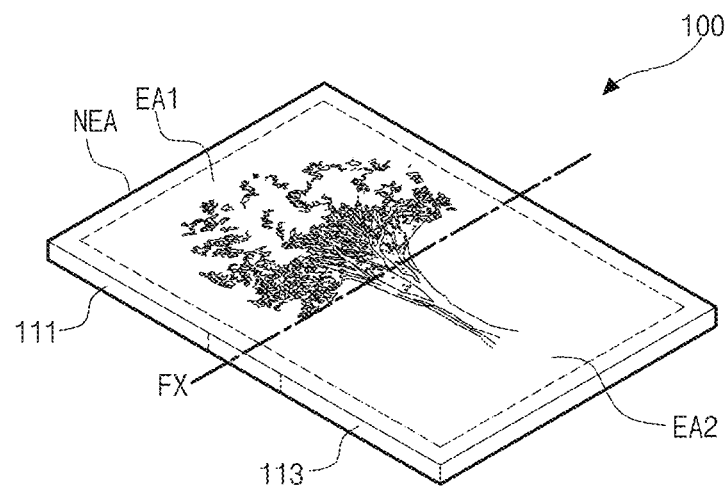
FIG. 1A is a perspective view schematically illustrating an unfolding state of a foldable display device according to a first embodiment of the present disclosure.
Figure 1B:
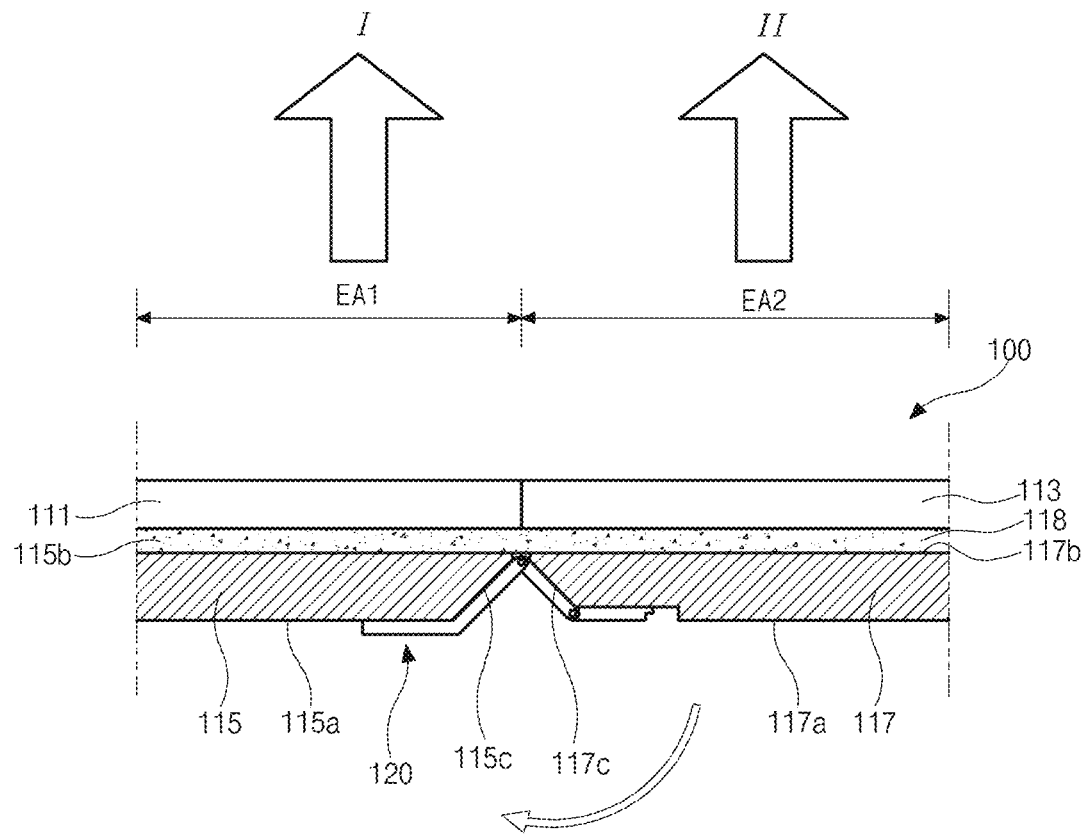
FIG. 1B is a cross-sectional view enlarging a part of the foldable display device of FIG. 1A.
Figure 1C:
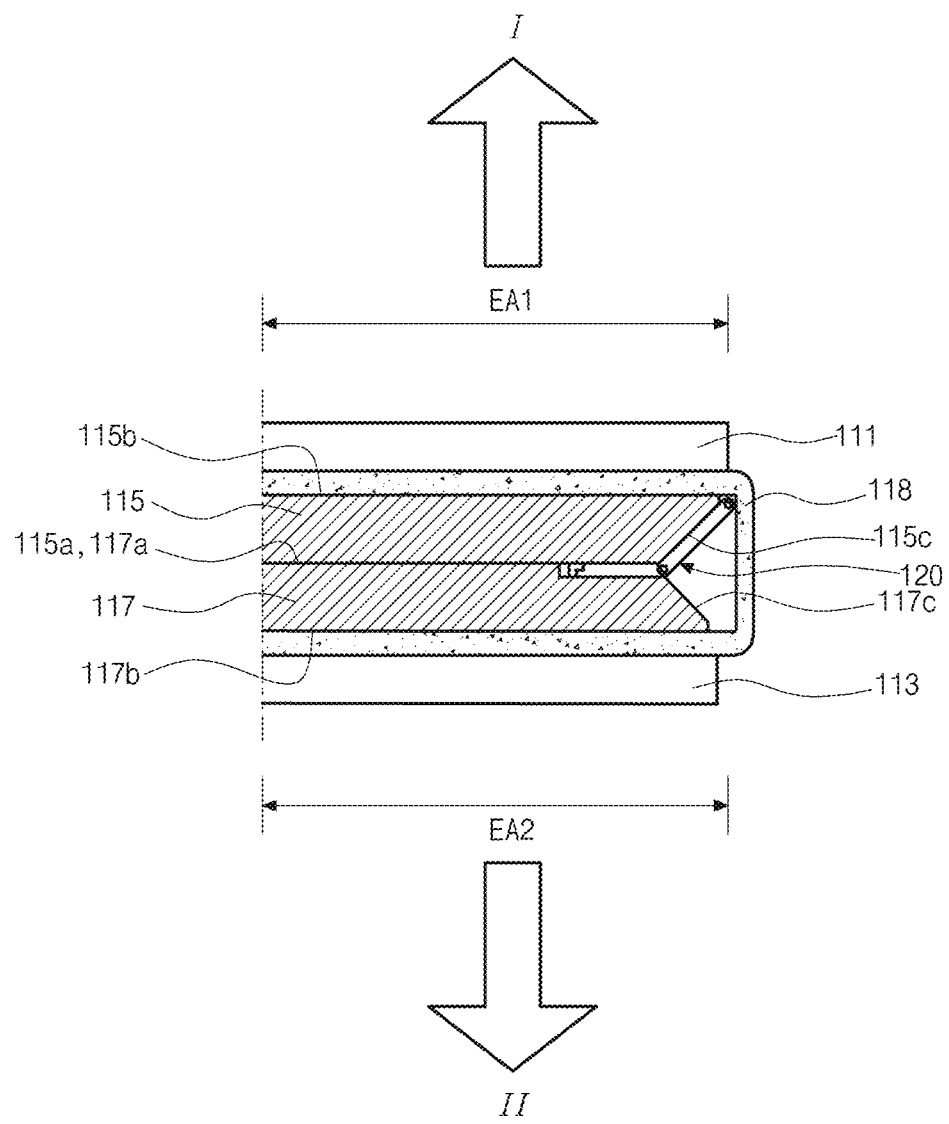
FIG. 1C is a cross-sectional view schematically illustrating a folding state of the foldable display device according to the first embodiment of the present disclosure.

FIG. 1A is a perspective view schematically illustrating an unfolding state of a foldable display device according to a first embodiment of the present disclosure, FIG. 1B is a cross-sectional view enlarging a part of the foldable display device of FIG. 1A, and FIG. 1C is a cross-sectional view schematically illustrating a folding state of the foldable display device according to the first embodiment of the present disclosure.

As shown in FIG. 1A, the foldable display device 100 is divided into a first display area EA1 and a second display area EA2 in which an image is implemented with respect to a folding axis FX. The first display area EA1 is defined by a first display panel 111, and the second display area EA2 is defined by a second display panel 113.

The first and second display area EA1 and EA2 may implement different images or may implement an image at the same time as shown in the figure.

In addition, with reference to FIG. 1C, the first and second display areas EA1 and EA2 may implement different images or the same image in the folding state.

As shown in FIG. 1B, first and second system units 115 and 117 are disposed on rear surfaces opposite front surfaces of the first and second display panels 111 and 113 through which the image is implemented in order to support the first and second display panels 111 and 113, respectively. An elastic plate 118 is disposed between the first and second display panels 111 and 113 and the first and second system units 115 and 117.

Accordingly, the folding state and the unfolding state of the foldable display device 100 are possibly supported by the first and second system units 115 and 117 and the elastic plate 118.

Namely, the first and second display panels 111 and 113 are supported by the first and second system units 115 and 117, which are connected in series, respectively. Since the second system unit 117 is rotatably connected from the first system unit 115, the first and second display areas EA1 and EA2 are folded to implement images I and II toward different directions or unfolded to implement the images I and II toward the same direction according to rotation of the second system unit 117.

Therefore, as shown in FIG. 1C, the second display panel 113 and the second system unit 117 rotate clockwise in the context of the figure along the folding axis FX, and the foldable display device 100 is in an out-folding state such that the first and second display areas EA1 and EA2 implement the images I and II toward the different directions, that is, opposite directions.

To do this, side surfaces 115c and 117c of the first and second system units 115 and 117 facing each other are formed to have predetermined inclinations in opposite directions. Thus, areas of the first and second system units 115 and 117 decrease from upper surfaces 115b and 117b of the first and second system units 115 and 117 contacting the elastic plate 118 to rear surfaces 115a and 117a of the first and second system units 115 and 117, and the side surfaces of the first and second system units 115 and 117 facing each other are farther away from each other toward the rear surfaces 115a and 117a.

The first and second system units 115 and 117 provide a storage space where driving circuits (not shown) or the like of the first and second display panels 111 and 113 can be disposed and support the first and second display panels 111 and 113 at the same time. In particular, when the foldable display device 100 is in the folding state, the first and second system units 115 and 117 prevent a radius of curvature of the second display panel 113 from being less than a radius of curvature of the foldable display device 100, thereby stably maintaining the folding state.

Here, the elastic plate 118, which is disposed between the first and second system units 115 and 117 and the first and second display panels 111 and 113, enables the foldable display device 100 in the folding state to be easily operated in the unfolding state through an elastic restoring force.

The elastic plate 118 may be formed to have the same size as the foldable display device 100 or may be formed to have a lattice plate structure in which a length and a width thereof are the same as the foldable display device 100 but some portions of a central area are opened.

The elastic plate 118 may be formed of a rubber material such as Buna N rubber, neoprene, Buna S rubber, silicone rubber or polybutadiene, a silicone compound, or a polymer compound made of a material such as poly dimethyl siloxane (PDMA) or benzophenone.

The elastic plate 118 is provided to be adhered to the first and second display panels 111 and 113, and an area excluding the adhered portion is stretched by the elastic force.

Specifically, the foldable display device 100 according to the first embodiment of the present disclosure further includes a hinge system 120 for rotatably connecting the second system unit 117 from the first system unit 115. While the hinge system 120 rotatably connects the second system unit 117 from the first system unit 115, the hinge system 120 also serves to restrain the first and second system units 115 and 117 so as to maintain the folding state of the foldable display device 100.

A plurality of hinge systems 120 may be spaced apart from each other along a length direction between the first and second system units 115 and 117.

Hereinafter, the hinge system 120 according to the first embodiment of the present disclosure will be described in more detail with reference to the drawings below.

Figure 2A:
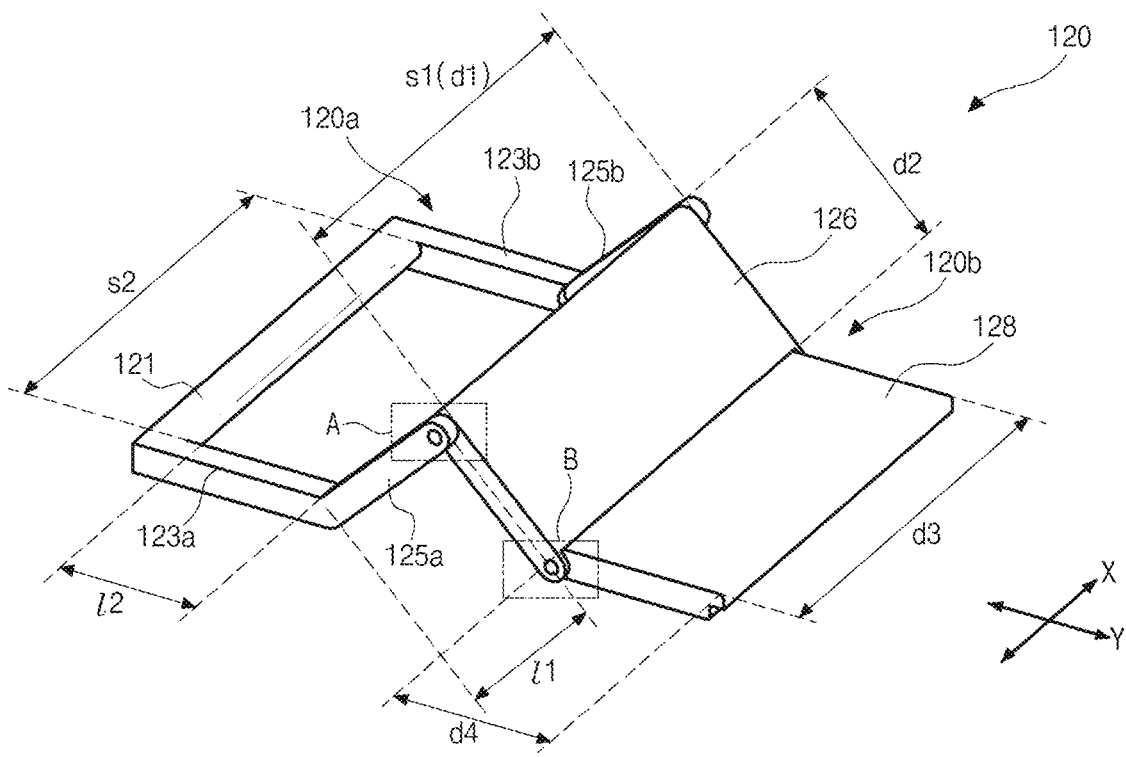
FIG. 2A is a perspective view schematically illustrating the hinge system according to the first embodiment of the present disclosure.
Figure 2B:
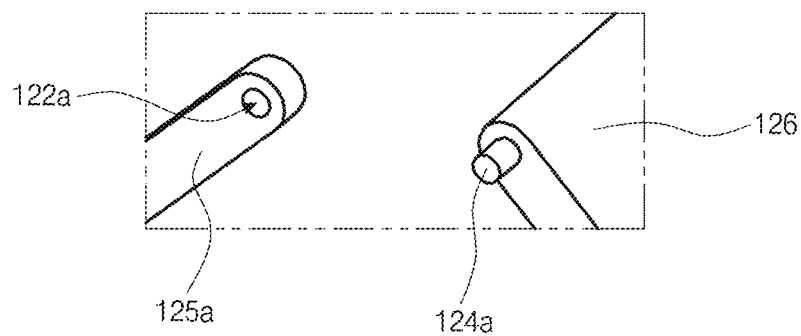
FIG. 2B is an exploded view enlarging an area A of FIG. 2A.
Figure 2C:
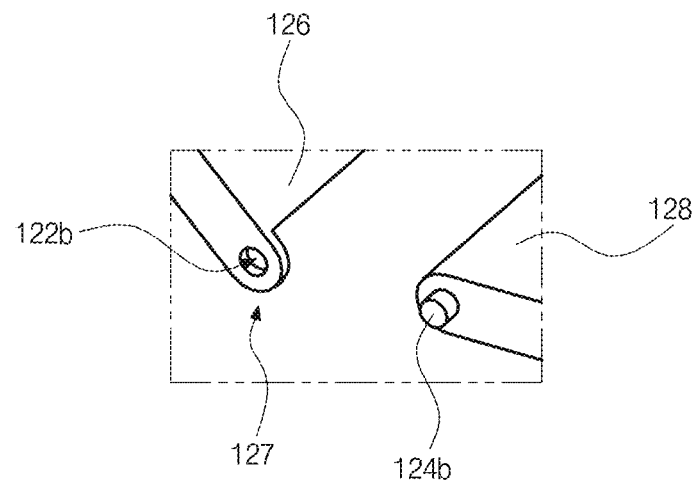
FIG. 2C is an exploded view enlarging an area B of FIG. 2A.
Figure 2D:
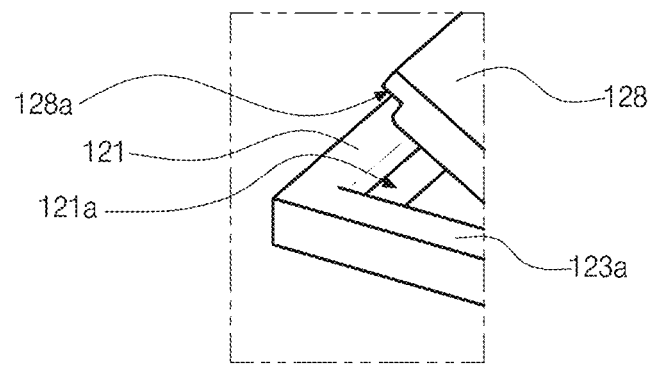
FIG. 2D is a schematic view enlarging a stepped end of a first plate bar and a protruding end of a second plate of FIG. 2A.

FIG. 2A is a perspective view schematically illustrating the hinge system according to the first embodiment of the present disclosure, FIG. 2B is an exploded view enlarging an area A of FIG. 2A, FIG. 2C is an exploded view enlarging an area B of FIG. 2A, and FIG. 2D is a schematic view enlarging a stepped end of a first plate bar and a protruding end of a second plate of FIG. 2A, which are shown upside down for the convenience of illustration.

FIGS. 3A to 3E are perspective views schematically illustrating operation of the hinge system according to the first embodiment of the present disclosure.

As shown in FIG. 2A, the hinge system 120 is divided into a first hinge portion 120a and a second hinge portion 120b. The first hinge portion 120a is fixed to the first system unit 115 of FIG. 1C, and the second hinge portion 120b is fixed to the second system unit 117 of FIG. 1C.

The first hinge portion 120a includes a first plate bar 121, a second plate bar 123a and a third plate bar 123b. The first plate bar 121 has a bar shape and extends in a first direction, that is, an X direction in the context of the figure. The second and third plate bars 123a and 123b each have a bar shape and extend from both ends of the first plate bar 121 in a second direction, that is, a Y direction in the context of the figure, perpendicular to the first direction. The first, second and third plate bars 121, 123a and 123b form a U-like shape.

The first hinge portion 120a further includes a fourth plate bar 125a and a fifth plate bar 125b. The fourth plate bar 125a extends upward at a predetermined angle from the second plate bar 123a, and the fifth plate bar 125b extends upward at a predetermined angle from the third plate bar 123b.

In the first hinge portion 120a, the first, second and third plate bars 121, 123a and 123b are fixed at the rear surface 115a of the first system unit 115 of FIG. 1C, and the fourth and fifth plate bars 125a and 125b are fixed at the side surface 115c of the first system unit 115 of FIG. 1C. The predetermined angles respectively formed by the second and third plate bars 123a and 123b and the fourth and fifth plate bars 125a and 125b correspond to the inclination of the side surface 115c of the first system unit 115 of FIG. 1C.

The second hinge portion 120b includes a first plate 126 and a second plate 128 having a plate shape. The first plate 126 is rotatably hinge-combined to with the fourth and fifth plate bars 125a and 125b of the first hinge portion 120a.

That is, as shown in FIG. 2B, a first fixing hole 122a is provided at one end of each of the fourth and fifth plate bars 125a and 125b, and a first fixing protrusion 124a is provided at each of both side surfaces of a first edge of the first plate 126.

The first edge of the first plate 126 is disposed between the fourth and fifth plate bars 125a and 125b of the first hinge portion 120a, and the first fixing protrusion 124a is put and inserted into the first fixing hole 122a provided at the one end of each of the fourth and fifth plate bars 125a and 125b.

At this time, the first fixing protrusion 124a and the first fixing hole 122a are formed in a circular shape, and the first plate 126 is rotatably hinge-combined with the fourth and fifth plate bars 125a and 125b in the state that the first fixing protrusion 124a of the first plate 126 is put and inserted into the first fixing hole 122a of the fourth and fifth plate bars 125a and 125b.

Additionally, in the second hinge portion 120b, the second plate 128 is rotatably hinge-combined with the first plate 126.

As shown in FIG. 2C, a couple of fixing holders 127 are provided at a second edge of the first plate 126. That is, a fixing holder 127 is provided at each of both side surfaces of the second edge of the first plate 126. A second fixing hole 122b is provided in the fixing holder 127.

A second fixing protrusion 124b is provided at each of both side surfaces of a first edge of the second plate 128 and is put and inserted into the second fixing hole 122b. The first edge of the second plate 128 is disposed between the couple of fixing holders 127 of the first plate 126, and the second fixing protrusion 124b is put and inserted into the second fixing hole 122b provided in each of the couple of fixing holders 127.

At this time, the second fixing protrusion 124b and the second fixing hole 122b are formed in a circular shape, and the second plate 128 is rotatably hinge-combined with the first plate 126 in the state that the second fixing protrusion 124b is put and inserted into the second fixing hole 122b of each of the couple of fixing holders 127.

Namely, the first hinge portion 120a and the second hinge portion 120b are rotatably hinge-combined with each other, and the first and second plates 126 and 128 of the second hinge portion 120b are also rotatably hinge-combined with each other.

In this case, as shown in FIG. 2D, a protruding end 128a is provided along a second edge of the second plate 128 of the second hinge portion 120b, and a stepped end 121a is provided along a length direction of the first plate bar 121 of the first hinge portion 120a, that is, along the first direction. The protruding end 128a of the second plate 128 is put and inserted into the stepped end 121a.

Here, the stepped end 121a is provided at a side of the first plate bar 121 adjacent to first ends of the second and third plate bars 123a and 123b opposite second ends of the second and third plate bars 123a and 123b from which the fourth and fifth plate bars 125a and 125b of the first hinge portion 120a are provided to be inclined upward at the predetermined angle. That is, the stepped end 121a is provided at the side of the first plate bar 121 facing the second hinge portion 120b. When the second hinge portion 120b is rotated toward the first hinge portion 120a, the protruding end 128a provided at the second edge of the second plate 128 of the second hinge portion 120b is interlocked with and inserted into the stepped end 121a provided at the first plate bar 121 of the first hinge portion 120a, so that the hinge system 120 is restrained in the folding state.

At this time, it is beneficial that a first width d1 of the first plate 126 in the X direction defined in the figure corresponds to a first distance s1 between the fourth and fifth plate bars 125a and 125b of the first hinge portion 120a, a second width d2 of the first plate 126 in the Y direction defined in the figure corresponds to a length l1 of the fourth and fifth plate bars 125a and 125b, a third width d3 of the second plate 128 in the X direction defined in the figure corresponds to a distance s2 between the second and third plate bars 123a and 123b of the first hinge portion 120a, and a fourth width d4 of the second plate 128 excluding the protruding end 128a in the Y direction defined in the figure corresponds to a length 12 of the second and third plate bars 123a and 123b extending perpendicularly to the first plate bar 121.

Figure 3A:
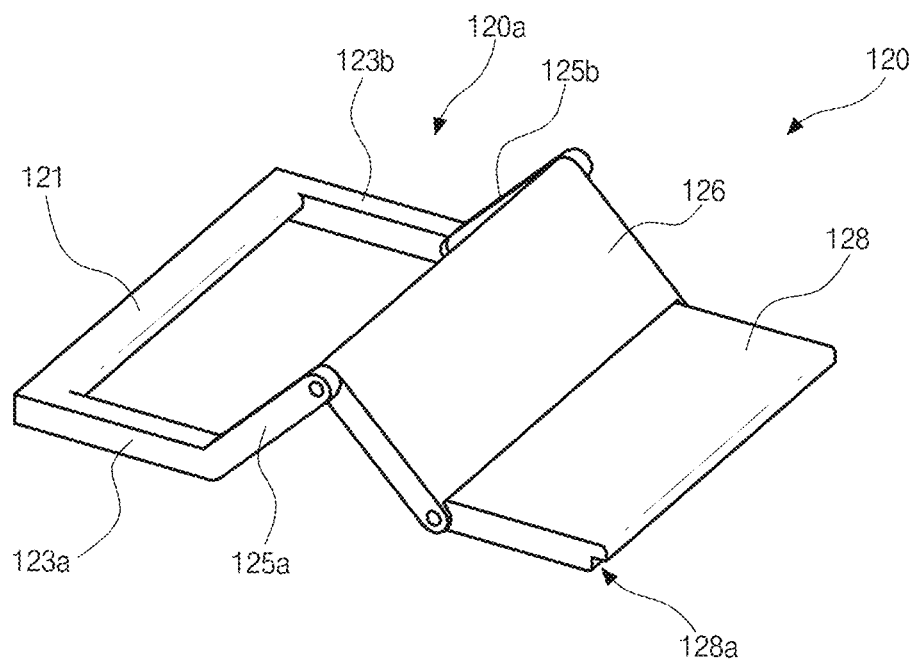
FIGS. 3A to 3E are perspective views schematically illustrating operation of the hinge system according to the first embodiment of the present disclosure.
Figure 3B:
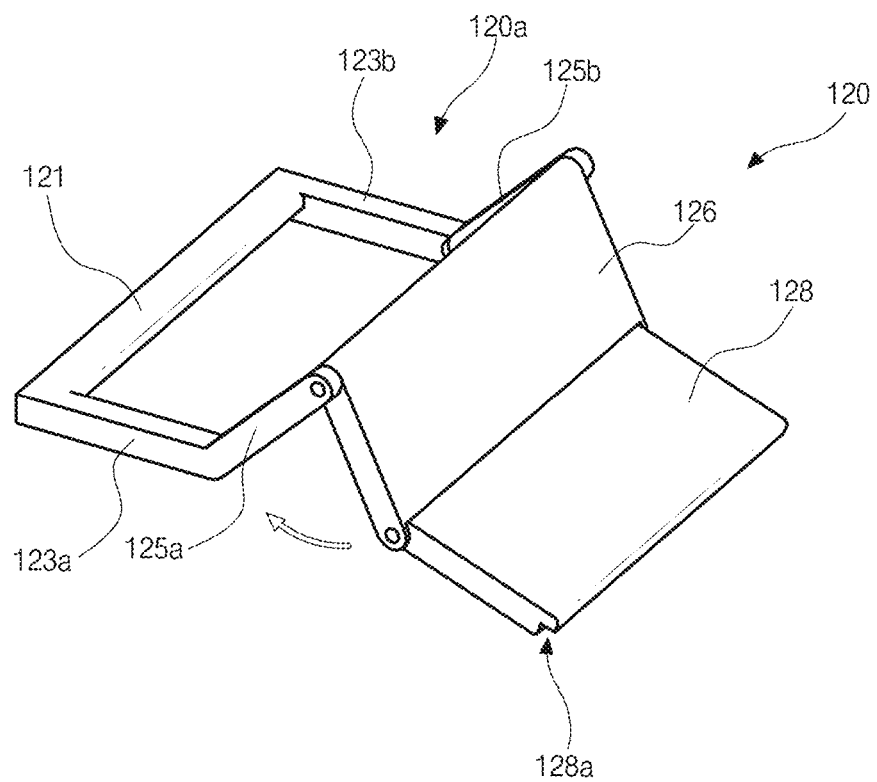

The operation of the hinge system 120 will be described in more detail with reference to FIGS. 3A to 3E. As shown in FIG. 3A, the first hinge portion 120a and the second hinge portion 120b are hinge-combined with each other, and in this state, as shown in FIG. 3B, the first plate 126 of the second hinge portion 120b is rotated clockwise defined in the figure through the first fixing protrusion 124a provided at the first plate 126 and the first fixing hole 122a provided at each of the fourth and fifth plate bars 125a and 125b such that the fourth and fifth plate bars 125a and 125b of the first hinge portion 120a and the first plate 126 become close to each other.

Figure 3C:
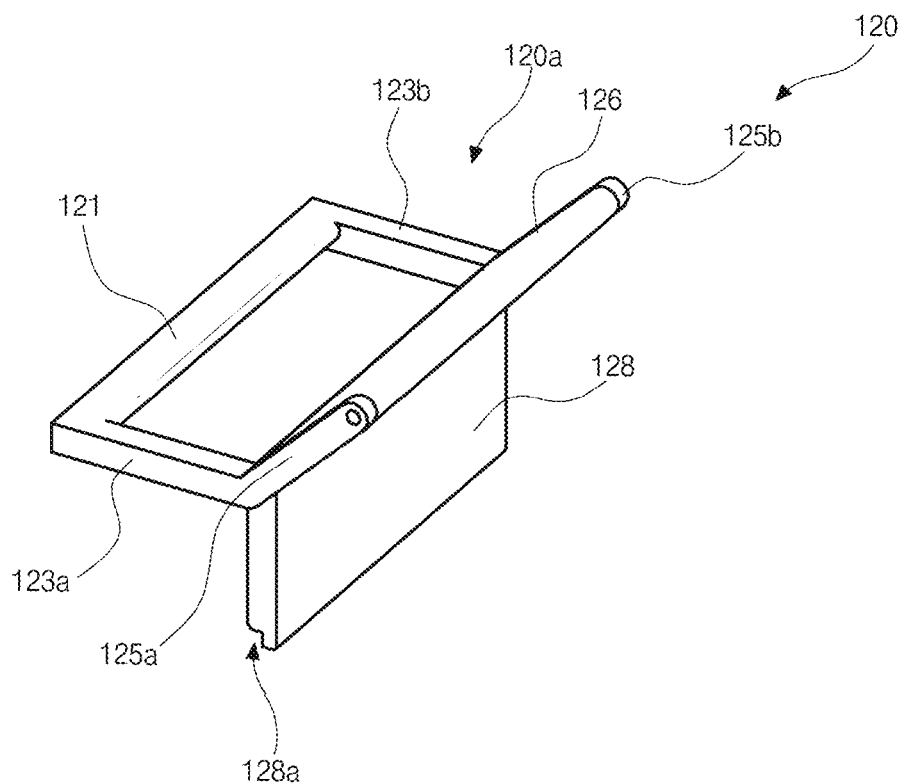

As shown in FIG. 3C, the first plate 126 is rotated until it is completely disposed between the fourth and fifth plate bars 125a and 125b of the first hinge portion 120a so that the first plate 126 and the fourth and fifth plate bars 125a and 125b form a plane with each other, that is, are on the same plane.

Figure 3D:
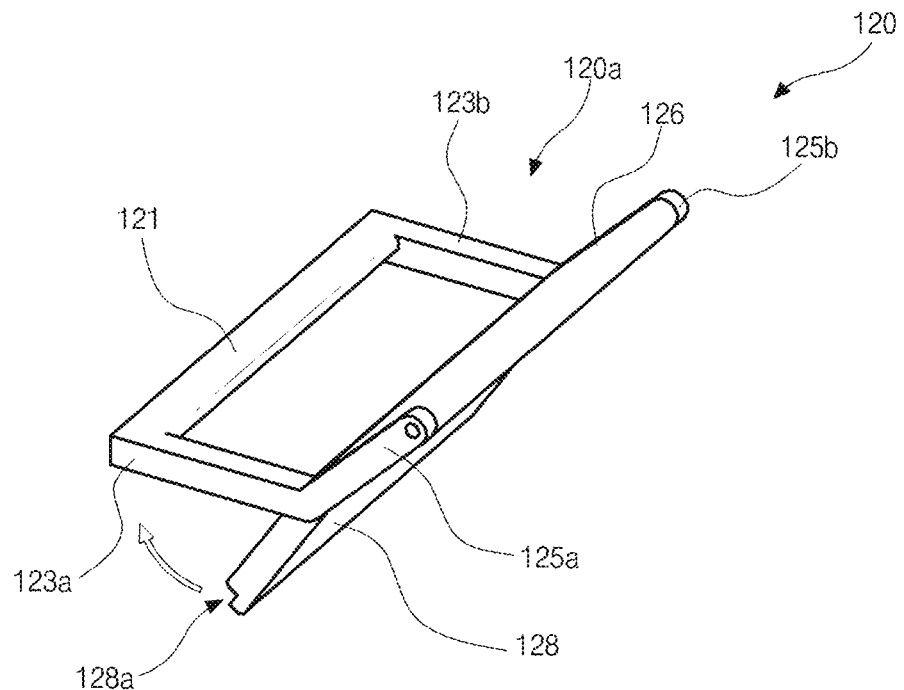
Figure 3E:
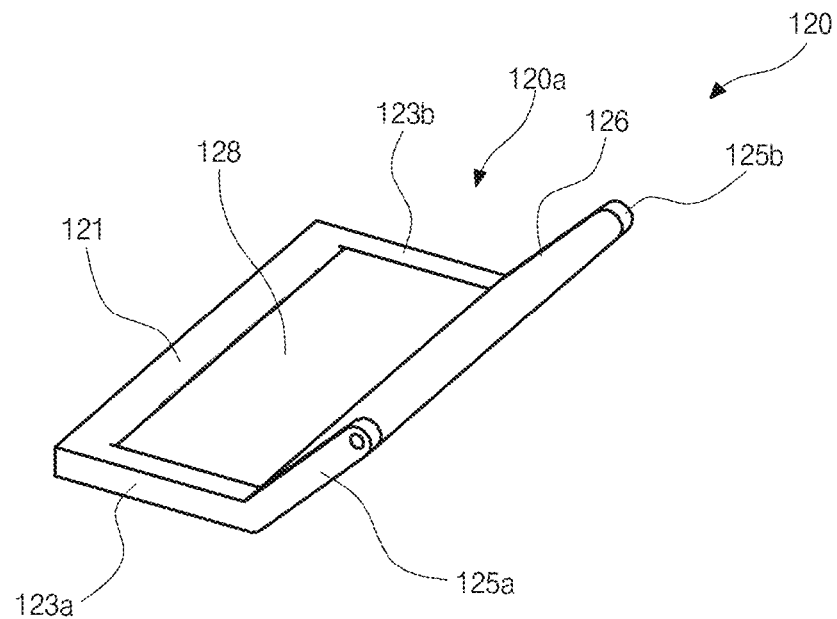

Next, when the first plate 126 and the fourth and fifth plate bars 125a and 125b are on the same plane, as shown in FIG. 3D, the second plate 128 is rotated clockwise defined in the figure from the first plate 126 through the second fixing protrusion 124b of the second plate 128 and the second fixing hole 122b provided at the first plate 126. Then, as shown in FIG. 3E, the second plate 128 is completely disposed between the first plate bar 121 and the second and third plate bars 123a and 123b, and the second plate 128 and the first, second and third plate bars 121, 123a and 123b form a plane with each other, that is, are on the same plane, thereby completing the operation of the hinge system 120.

At this time, the protruding end 128a provided at the second edge of the second plate 128 is put and inserted into the stepped end 121a provided at the first plate bar 121, so that the first and second hinge portions 120a and 120b are restrained in the folding state.

That is, the foldable display device 100 of FIG. 1C according to the first embodiment of the present disclosure can be easily supported in the folding state and the unfolding state by disposing the elastic plate 118 of FIG. 1C and the first and second system units 115 and 117 under the first and second display panels 111 and 113 of FIG. 1C and enabling the first and second system units 115 and 117 of FIG. 1C to be rotatably connected to each other through the hinge system 120.

FIGS. 4A to 4E are cross-sectional views schematically illustrating the operation of the foldable display device in the folding state and the unfolding state in accordance with the operation of the hinge system. FIG. 5A is an enlarged view illustrating upper surfaces of the first and second system units to which the hinge system is fixed, and FIG. 5B is an enlarged view illustrating the rear surfaces of the first and second system units to which the hinge system is fixed.

Figure 4A:
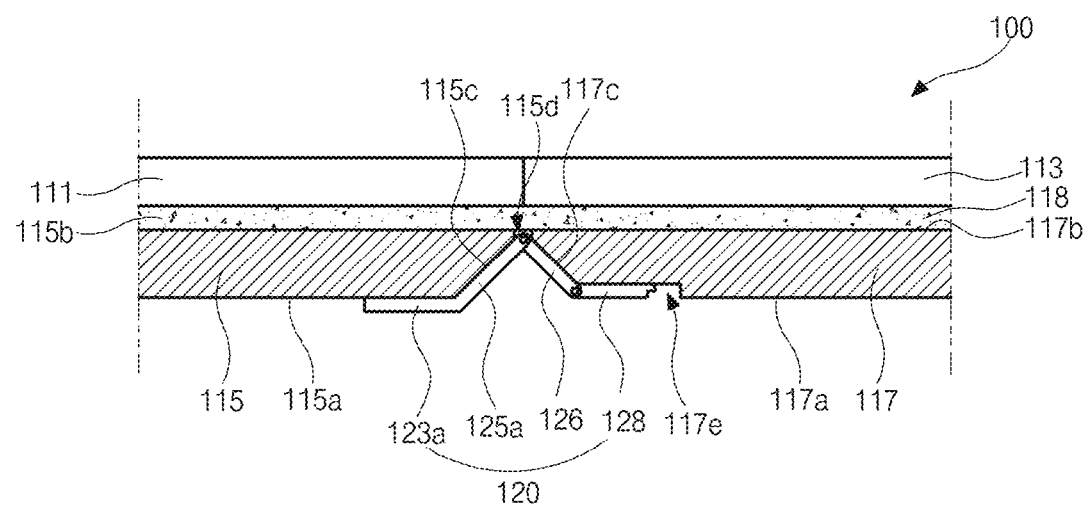
FIGS. 4A to 4E are cross-sectional views schematically illustrating the operation of the foldable display device in the folding state and the unfolding state in accordance with the operation of the hinge system.
Figure 5A:
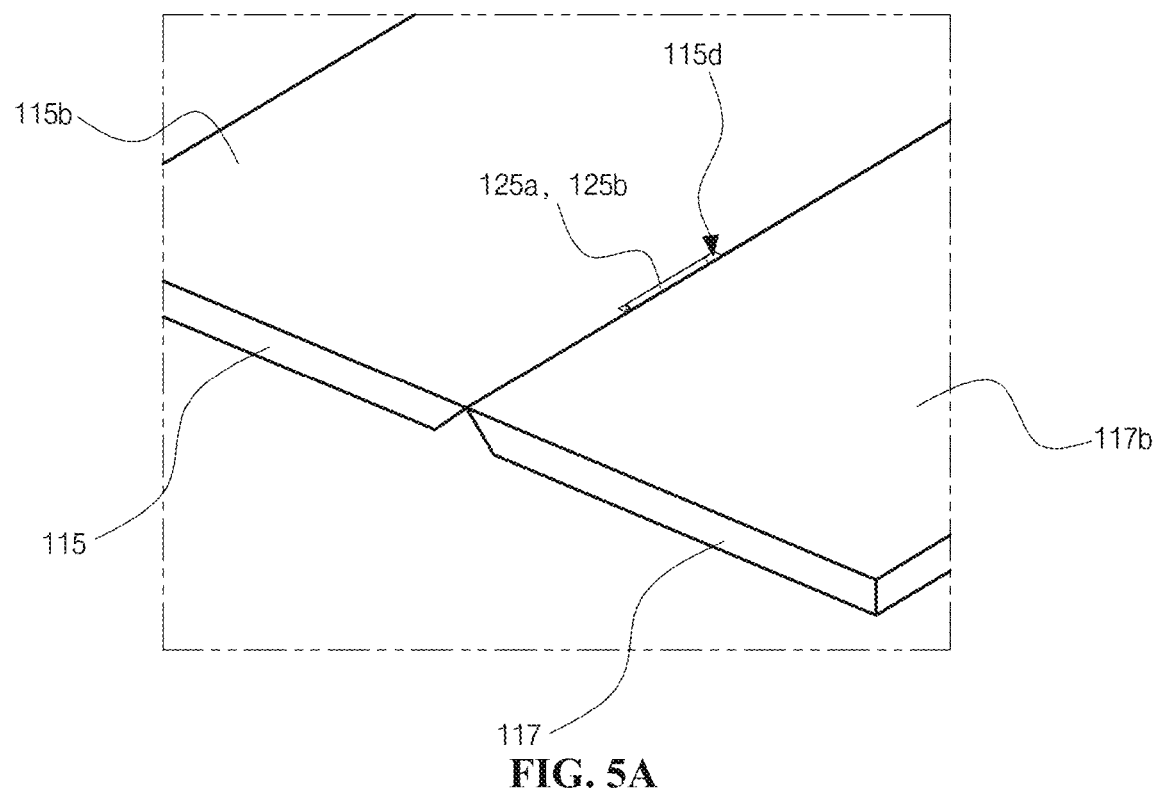
FIG. 5A is an enlarged view illustrating upper surfaces of the first and second system units to which the hinge system is fixed.
Figure 5B:
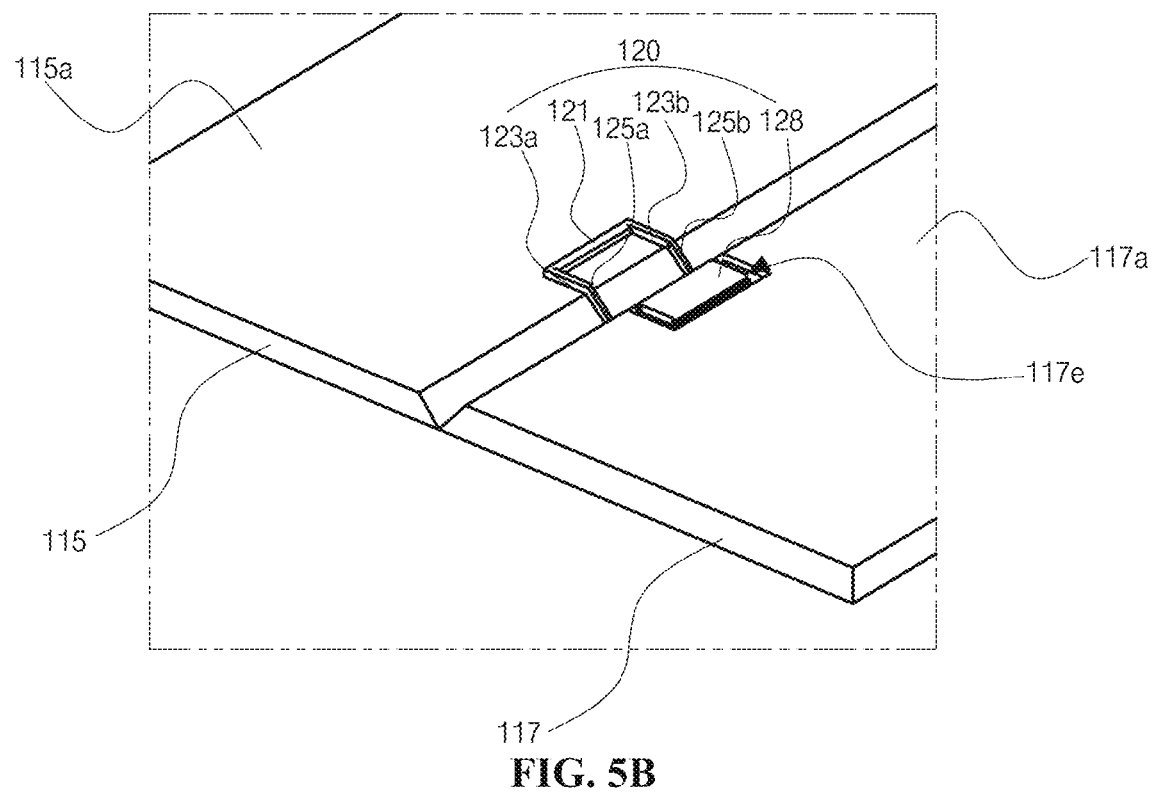
FIG. 5B is an enlarged view illustrating rear surfaces of the first and second system units to which the hinge system is fixed.

As shown in FIG. 4A, the elastic plate 118 is disposed on the first and second system units 115 and 117, which are connected in series, the first display panel 111 is disposed on the elastic plate 118 to correspond to the first system unit 115, and the second display panel 113 is disposed on the elastic plate 118 to correspond to the second system unit 117.

In addition, the hinge system 120 is disposed on the rear surfaces 115a and 117a of the first and second system units 115 and 117. The first, second and third plate bars 121, 123a and 123b of the first hinge portion 120a of the hinge system 120 are in close contact with and fixed to the rear surface 115a of the first system unit 115, and the fourth and fifth plate bars 125a and 125b of the first hinge portion 120a are in close contact with and fixed to the side surface 115c of the first system unit 115.

The second plate 128 of the second hinge portion 120b is in close contact with and fixed to the rear surface 117a of the second system unit 117, and the first plate 126 is in close contact with and fixed to the side surface 117c of the second system unit 117.

At this time, as shown in FIG. 5A, a hole 115d is provided on the upper surfaces 115b and 117b of the first and second system units 115 and 117 to expose the first edge of the first plate 126 of the hinge system 120 and the one ends of the fourth and fifth plate bars 125a and 125b connected to the first edge of the first plate 126. As shown in FIG. 5B, an indentation 117e in which the first plate 126 and the second plate 128 of the hinge system 120 are placed is provided on the rear surface 117a of the second system unit 117.

Here, the indentation 117e in which the first and second plates 126 and 128 are placed may be formed larger than the first and second plates 126 and 128 such that the first, second, third, fourth and fifth plate bars 121, 123a, 123b, 125a and 125b of the first hinge portion 120a are also placed in the indentation 117e when the hinge system 120 is completely folded.

The hole 115d provided on the upper surfaces 115b and 117b of the first and second system units 115 and 117 enables the first and second system units 115 and 117 to be in close contact with and connected in series to each other and also enables the first and second system units 115 and 117 to be freely operated without affecting the operation of the hinge system 120.

In addition, when the foldable display device 100 is in the folding state, since the rear surfaces 115a and 117a of the first and second system units 115 and 117 can be in completely close contact with each other due to the indentation 117e of the second system unit 117, the foldable display device 100 can be maintained more stably in the folding state even if the hinge system 120 is disposed on the rear surfaces 115a and 117a of the first and second system units 115 and 117.

Figure 4B:
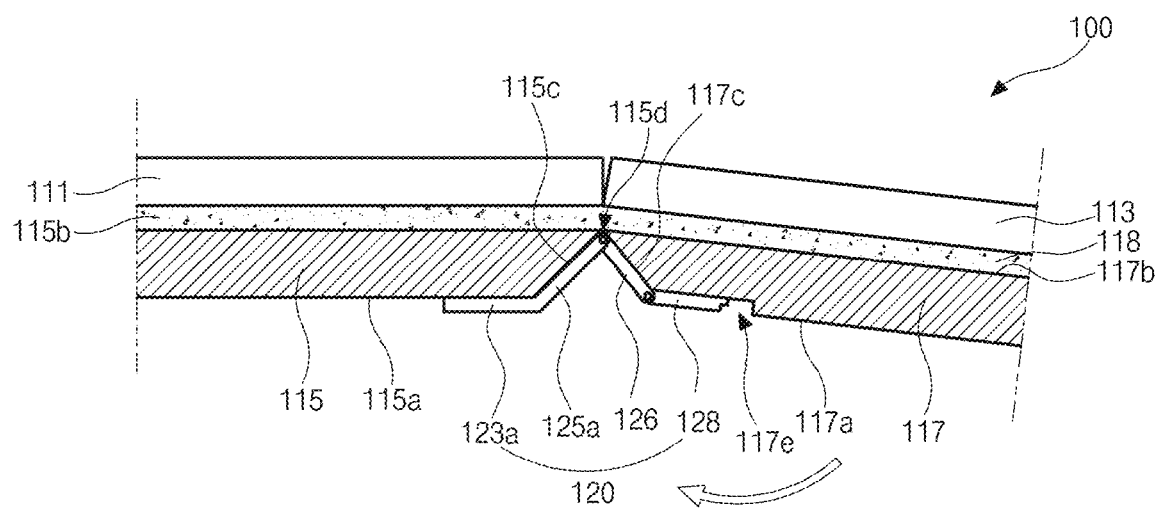

As shown in FIG. 4B, the second display panel 113 and the second system unit 117 are rotated clockwise defined in the figure, and in this case, the first plate 126 of the second hinge portion 120b is rotated clockwise defined in the figure through the first fixing protrusion 124a provided at the first plate 126 and the first fixing hole 122a provided at each of the fourth and fifth plate bars 125a and 125b such that the fourth and fifth plate bars 125a and 125b of the first hinge portion 120a and the first plate 126 of the second hinge portion 120b are close to each other.

Figure 4C:
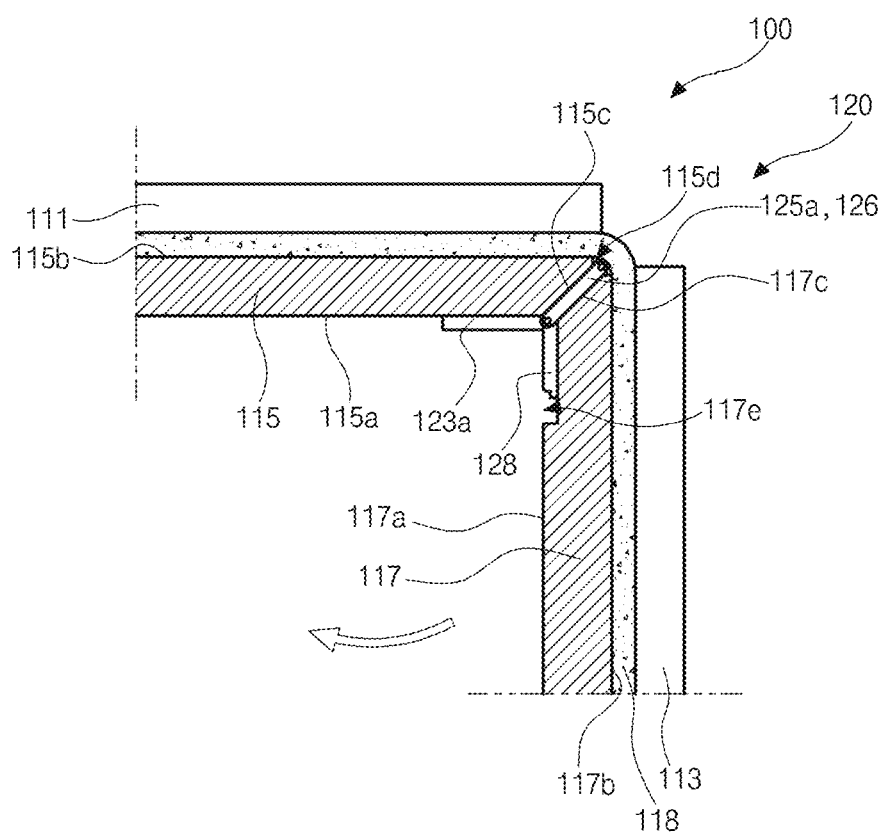

Next, as shown in FIG. 4C, the second display panel 113 and the second system unit 117 are further rotated clockwise defined in the figure, so that the first display panel 111 and the second display panel 113 implement images toward respective directions perpendicular to each other.

Here, since the side surfaces 115c and 117c of the first system unit 115 and the second system unit 117 facing each other are in close contact with each other, the first plate 126 of the hinge system 120 is completely disposed between the fourth and fifth plate bars 125a and 125b, and the first plate 126 and the fourth and fifth plate bars 125a and 125b form a plane with each other, that is, are on the same plane.

At this time, the elastic plate 118 disposed between the first and second system units 115 and 117 and the first and second display panels 111 and 113 is partially stretched through a predetermined elastic modulus, so that a part of the elastic plate 118 is exposed to the outside between the first and second display panels 111 and 113.

Figure 4D:
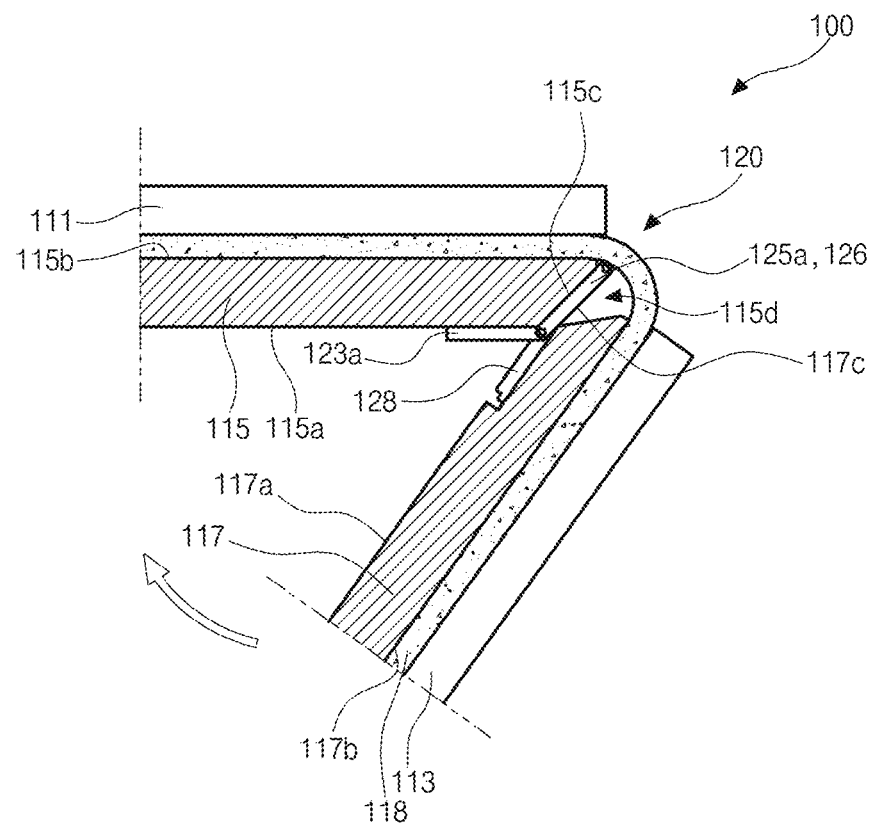

Next, as shown in FIG. 4D, the second display panel 113 and the second system unit 117 are further rotated clockwise defined in the figure, and at this time, the second plate 128 of the second hinge portion 120b is rotated clockwise defined in the figure through the second fixing protrusion 124b provided at the first edge of the second plate 128 and the second fixing hole 122b provided at the second edge of the first plate 126 such that the second plate 128 and the first, second and third plate bars 121, 123a and 123b of the hinge system 120 are close to each other.

At this time, the elastic plate 118 is further stretched, and the part of the elastic plate 118 is further exposed to the outside between the first and second display panels 111 and 113.

Figure 4E:
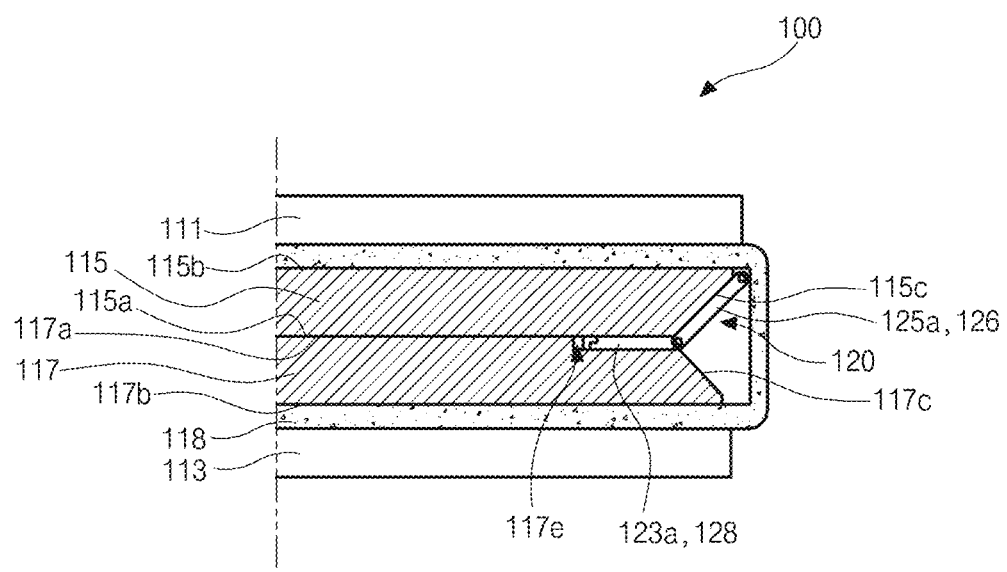

Then, as shown in FIG. 4E, the second display panel 113 and the second system unit 117 are further rotated clockwise defined in the figure, and the rear surface 117a of the second system unit 117 and the rear surface 115a of the first system unit 115 are in close contact with each other, so that the foldable display device 100 is in the folding state to implement the images of the first and second display panels 111 and 113 in opposite directions.

In this case, the second plate 128 of the hinge system 120 is completely disposed between the first, second and third plate bars 121, 123a and 123b. The second plate 128 and the first, second and third plate bars 121, 123a and 123b form a plane with each other, that is, are on the same plane and are placed in the indentation 117e provided on the rear surface 117a of the second system unit 117.

At this time, the protruding end 128a provided along the second edge of the second plate 128 is put and inserted into the stepped end 121a provided in the first plate bar 121, so that the hinge system 120 is restrained in the folding state, and the foldable display device 100 is maintained in the folding state by the binding force of the hinge system 120.

Here, the elastic plate 118 is further stretched to surround the side surfaces 115c and 117c of the first and second system units 115 and 117.

Then, when the foldable display device 100 is operated from the folding state to the unfolding state by applying an external pressure larger than the binding force of the hinge system 120, the foldable display device 100 in the folding state can be easily operated to be in the unfolding state through the elastic restoring force of the elastic plate 118.

The foldable display device 100 according to the first embodiment of the present disclosure can be easily supported in the folding state and the unfolding state by disposing the elastic plate 118 and the first and second system units 115 and 117 under the first and second display panels 111 and 113 and rotatably connecting the first and second system units 115 and 117 through the hinge system 120.

Specially, the structure of the hinge system 120, which supports the foldable display device 100 to be enabled in the folding state and the unfolding state, is simple, and the foldable display device 100 of the light weight and thin profile that has been recently required can be achieved. In addition, the process cost can be reduced, and the efficiency of the process can be improved.

Further, even though the hinge system 120 is exposed to the outside in the folding state, in the foldable display device 100 according to the first embodiment of the present disclosure, the hinge system 120 can be protected by the elastic plate 118 by disposing the elastic plate 118 between the first and second system units 115 and 117 and the first and second display panels 111 and 113.

Accordingly, it is possible to provide the foldable display device 100 with the improved durability against the impacts from the outside in the folding state.

Meanwhile, the first and second system units 115 and 117 may be formed of at least one metal material of copper (Cu), silver (Ag), aluminum (Al), iron (Fe), nickel (Ni) and tungsten (W) or an alloy including one or more thereof, or outer surfaces of the first and second system units 115 and 117 may plate with at least one metal material of nickel (Ni), silver (Ag) and gold (Au) or an alloy including one or more thereof.

When the first and second system units 115 and 117 are formed of aluminum (Al) having excellent thermal conductivity, the first and second system units 115 and 117 are beneficially formed of aluminum (Al) having a purity of 99.5%. In addition, a black oxide film may be formed on the surfaces of the first and second system units 115 and 117 through an anodizing treatment. Since the first and second system units 115 and 117 subjected to the anodizing treatment have a black color, the heat absorption rate increases, and thus the first and second system units 115 and 117 have relatively high thermal conductivities.

Accordingly, the first and second system units 115 and 117 effectively discharge high-temperature heat generated from the first and second display panels 111 and 113 to the outside.

Particularly, the first and second system units 115 and 117 are formed to have the side surfaces 115c and 117c with the predetermined inclinations, and the hole 115d is formed such that the part of the hinge system 120 is exposed, so that the high-temperature heat can be effectively discharged to the outside through the structure.

Second Embodiment

Figure 6A:
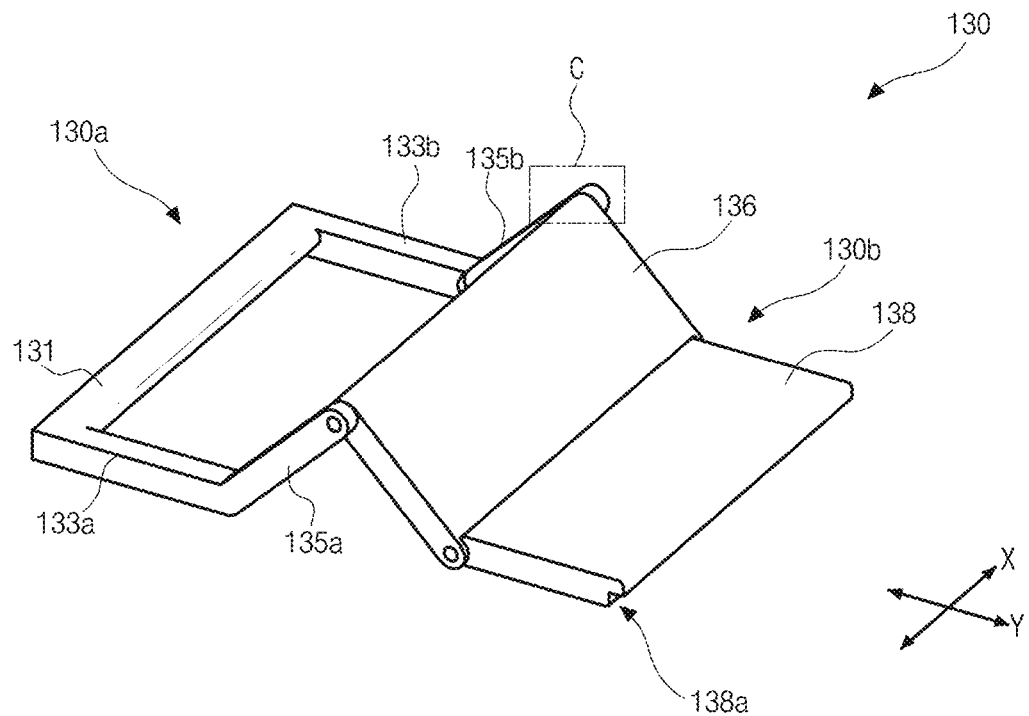
FIG. 6A is a perspective view schematically illustrating the hinge system according to a second embodiment of the present disclosure.
Figure 6B:
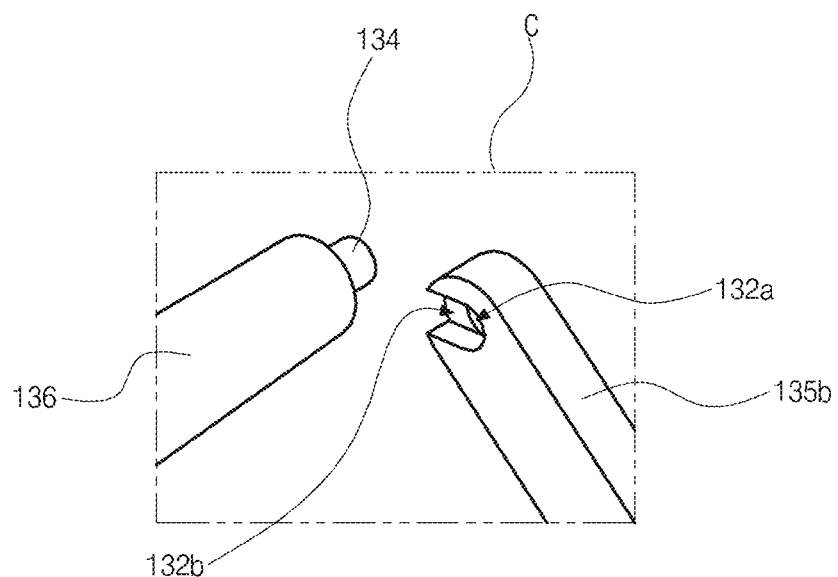
FIG. 6B is an exploded view enlarging an area C of FIG. 6A.

FIG. 6A is a perspective view schematically illustrating the hinge system according to a second embodiment of the present disclosure, FIG. 6B is an exploded view enlarging an area C of FIG. 6A.

As shown in FIG. 6A, the hinge system 130 according to the second embodiment of the present disclosure is divided into a first hinge portion 130a and a second hinge portion 130b.

The first hinge portion 130a includes a first plate bar 131, a second plate bar 133a and a third plate bar 133b. The first plate bar 131 has a bar shape and extends in a first direction, that is, an X direction in the context of the figure. The second and third plate bars 133a and 133b each have a bar shape and extend from both ends of the first plate bar 131 in a second direction, that is, a Y direction in the context of the figure, perpendicular to the first direction. The first, second and third plate bars 131, 133a and 133b form a U-like shape.

The first hinge portion 130a further includes a fourth plate bar 135a and a fifth plate bar 135b. The fourth plate bar 135a extends upward at a predetermined angle from the second plate bar 133a, and the fifth plate bar 135b extends upward at a predetermined angle from the third plate bar 133b.

The second hinge portion 130b includes a first plate 136 and a second plate 138 having a plate shape. The first plate 136 is rotatably hinge-combined to with the fourth and fifth plate bars 135a and 135b of the first hinge portion 130a.

In addition, the first plate 136 and the second plate 138 are rotatably hinge-combined with each other.

At this time, a protruding end 138a is provided along a second edge of the second plate 138 of the second hinge portion 130b, and a stepped end 121a of FIG. 2D is provided along a length direction of the first plate bar 131 of the first hinge portion 130a, that is, along the first direction. The protruding end 138a of the second plate 138 is put and inserted into the stepped end 121a of FIG. 2D. When the second hinge portion 130b is rotated toward the first hinge portion 130a, the protruding end 138a provided at the second edge of the second plate 138 of the second hinge portion 130b is interlocked with and inserted into the stepped end 121a of FIG. 2D provided at the first plate bar 131 of the first hinge portion 130a, so that the hinge system 130 is restrained in the folding state.

Here, when looking in more detail into the hinge-combination between the fourth and fifth plate bars 135a and 135b of the first hinge portion 130a and the first plate 136 of the second hinge portion 130b, as shown in FIG. 6B, a first fixing protrusion 134 is provided at each of both side surfaces of a first edge of the first plate 136, and a first fixing hole 132a is provided at one end of each of the fourth and fifth plate bars 135a and 135b.

The first edge of the first plate 136 is disposed between the fourth and fifth plate bars 135a and 135b of the first hinge portion 130a and the first fixing protrusion 134 is put and inserted into the first fixing hole 132a provided at the one end of each of the fourth and fifth plate bars 135a and 135b.

At this time, the first fixing protrusion 134 and the first fixing hole 132a are formed in a circular shape, and the first plate 136 is rotatably hinge-combined with the fourth and fifth plate bars 135a and 135b in the state that the first fixing protrusion 134 of the first plate 136 is put and inserted into the first fixing hole 132a of the fourth and fifth plate bars 135a and 135b.

Here, the first fixing protrusion 134 is formed of a magnet, that is, the first fixing protrusion 134 is formed of a ferromagnetic substance such as iron (Fe), cobalt (Co), nickel (Ni) or gadolinium (Gd), a rare-earth oxide containing a rare-earth ion, or a magnetic material made of garnet, orthoferrite, ilmenite or hexagonal ferrite.

Further, a film (not shown) made of metal is provided in the first fixing hole 132a, and the first fixing protrusion 134 is attached to the first fixing hole 132a through magnetism. Thus, the first plate is rotatably hinge-combined with the fourth and fifth plate bars 135a and 135b.

In particular, a guide groove 132b is provided in the first fixing hole 132a, so that the first fixing protrusion 134 can be separated from the first fixing hole 132a along the guide groove 132b by the pressure applied from the outside.

Namely, the fourth and fifth plate bars 135a and 135b of the first hinge portion 130a and the first plate 136 of the second hinge portion 130b are rotatably hinge-combined with each other through the first fixing hole 132a and the first fixing protrusion 134, the fourth and fifth plate bars 135a and 135b and the first plate 136 can also be easily separated from each other by the pressure applied from the outside.

Through this, in the hinge system 130 according to the second embodiment of the present disclosure, the first and second hinge portions 130a and 130b may be hinge-combined or separated according to a user's selection.

FIGS. 7A to 7E are cross-sectional views schematically illustrating the operation of the foldable display device in the folding state and the unfolding state in accordance with the operation of the hinge system according to the second embodiment of the present disclosure.

As shown in FIG. 7A, the first, second and third system units 115, 117 and 119 are connected in series, the elastic plate 118 is disposed on the first, second and third system units 115, 117 and 119, the first display panel 111 is disposed on the elastic plate 118 to correspond to the first system unit 115, and the second display panel 113 is disposed on the elastic plate 118 to correspond to the second system unit 117. In addition, a third display panel 114 is disposed on the elastic plate 118 to correspond to the third system unit 119.

That is, the foldable display device 100 according to the second embodiment of the present disclosure has a multi-folding structure.

Further, the hinge system 130 is disposed on the rear surfaces of the first, second and third system units 115, 117 and 119. A first hinge system 130-1 is disposed on the rear surfaces of the first and second system units 115 and 117, and a second hinge system 130-2 is disposed on the rear surfaces of the second and third system units 117 and 119.

In the first and second hinge systems 130-1 and 130-2, the first, second and third plate bars 131, 133a and 133b of the first hinge portion 130a of the first hinge system 130-1 is in close contact with and fixed to the rear surface 115a of the first system unit 115, and the fourth and fifth plate bars 135a and 135b of the first hinge portion 130a of the first hinge system 130-1 is in close contact with and fixed to one side surface 115c of the first system unit 115.

In addition, the second plate 138 of the second hinge portion 130b of the first hinge system 130-1 is in close contact with and fixed to the rear surface 117a of the second system unit 117, and the first plate 136 is in close contact with and fixed to one side surface 117c of the second system unit 117.

Further, the first, second and third plate bars 131, 133a and 133b of the first hinge portion 130a of the second hinge system 130-2 is in close contact with and fixed to the rear surface 119a of the third system unit 119, and the fourth and fifth plate bars 135a and 135b of the first hinge portion 130a of the second hinge system 130-2 is in close contact with and fixed to one side surface 119c of the third system unit 119.

Also, the second plate 138 of the second hinge portion 130b of the second hinge system 130-2 is in close contact with and fixed to the rear surface 117a of the second system unit 117, and the first plate 136 is in close contact with and fixed to another side surface 117d of the second system unit 117.

At this time, a hole 115d is provided on each of the upper surfaces 115b and 117b of the first and second system units 115 and 117 and the upper surfaces 117b and 119b of the second and third system units 117 and 119 to expose the first edges of the first plates 136 of the first and second hinge systems 130-1 and 130-2 and the one ends of the fourth and fifth plate bars 135a and 135b connected to the first edges of the first plates 136. First and second indentations 117e and 117f are provided on the rear surface 117a of the second system unit 117. The first plate 136 and the second plate 138 of the first hinge system 130-1 are placed in the first indentation 117e, and the first plate 136 and the second late 138 of the second hinge system 130-2 are placed in the second indentation 117f.

Here, the first and second indentations 117e and 117f in which the first and second plates 136 and 138 of the first and second hinge systems 130-1 and 130-2 are placed may be formed larger than the first and second plates 136 and 138 such that the first, second, third, fourth and fifth plate bars 131, 133a, 133b, 135a and 135b of the first hinge portions 130a of the first and second hinge systems 130-1 and 130-2 are also placed in the first and second indentations 117e and 117f when the first and second hinge systems 130-1 and 130-2 are completely folded.

Figure 7B:
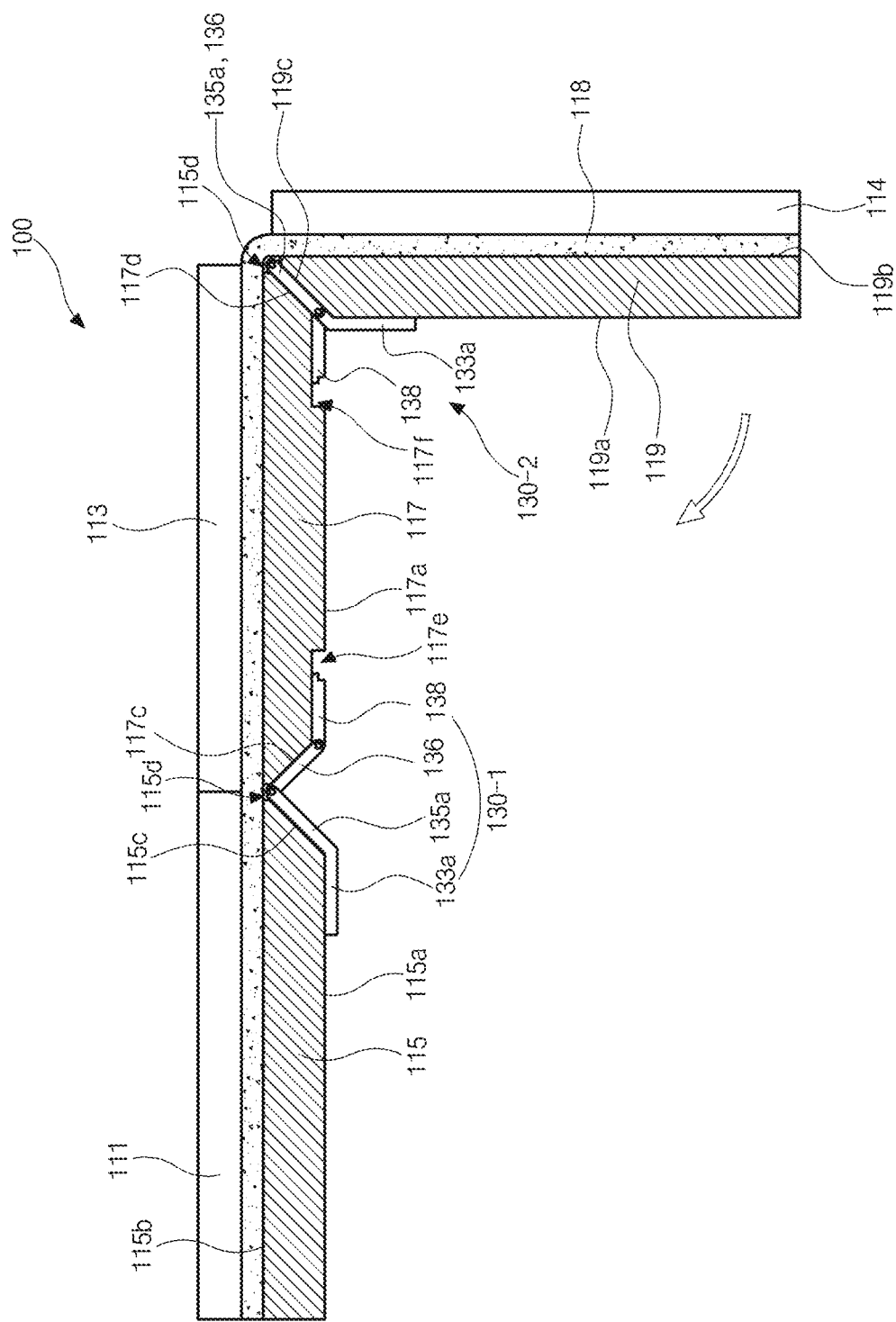

At this time, as shown in FIG. 7B, the third display panel 114 and the third system unit 119 are rotated clockwise defined in the figure, and in this case, the fourth and fifth plate bars 135a and 135b of the first hinge portion 130b are rotated clockwise defined in the figure through the first fixing protrusion 134 of FIG. 6B provided at the first plate 136 of the second hinge portion 130b and the first fixing hole 132a of FIG. 6B such that the fourth and fifth plate bars 135a and 135b of the first hinge portion 130a of the second hinge system 130-2 and the first plate 136 of the second hinge portion 130b are close to each other.

Figure 7C:
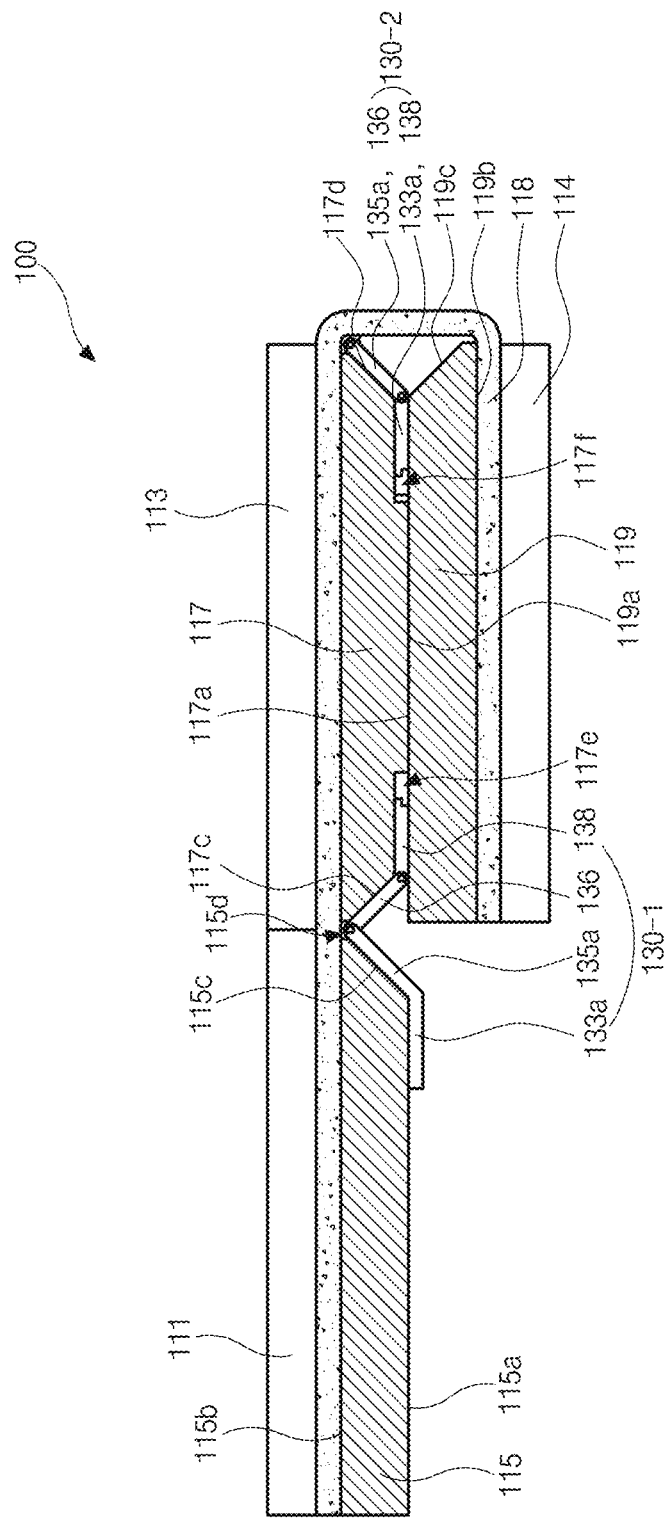

Next, as shown in FIG. 7C, the third display panel 114 and the third system unit 119 are further rotated clockwise defined in the figure, and the rear surface 119a of the third system unit 119 and the rear surface 117a of the second system unit 117 are in close contact with each other, thereby achieving the folding state of the second and third system units 117 and 119 such that the third display panel 114 and the second display panel 113 implement images toward opposite directions.

In this case, the second plate 138 of the second hinge system 130-2 is completely disposed between the first, second and third plate bars 131, 133a and 133b. The second plate 138 and the first, second and third plate bars 131, 133a and 133b form a plane with each other, that is, are on the same plane and are placed in the second indentation 117f provided on the rear surface 117a of the second system unit 117.

At this time, the protruding end 138a of FIG. 6A provided along the second edge of the second plate 138 is put and inserted into the stepped end 121a of FIG. 2D provided in the first plate bar 131, so that the second hinge system 130-2 is restrained in the folding state, and the second and third system units 117 and 119 are maintained in the folding state by the binding force of the second hinge system 130-2.

Here, the elastic plate 118 is stretched to surround the one side surfaces 117d and 119c of the second and third system units 117 and 119.

Accordingly, the second system unit 117 and the third system unit 119 are in the out-folding state.

Figure 7D:
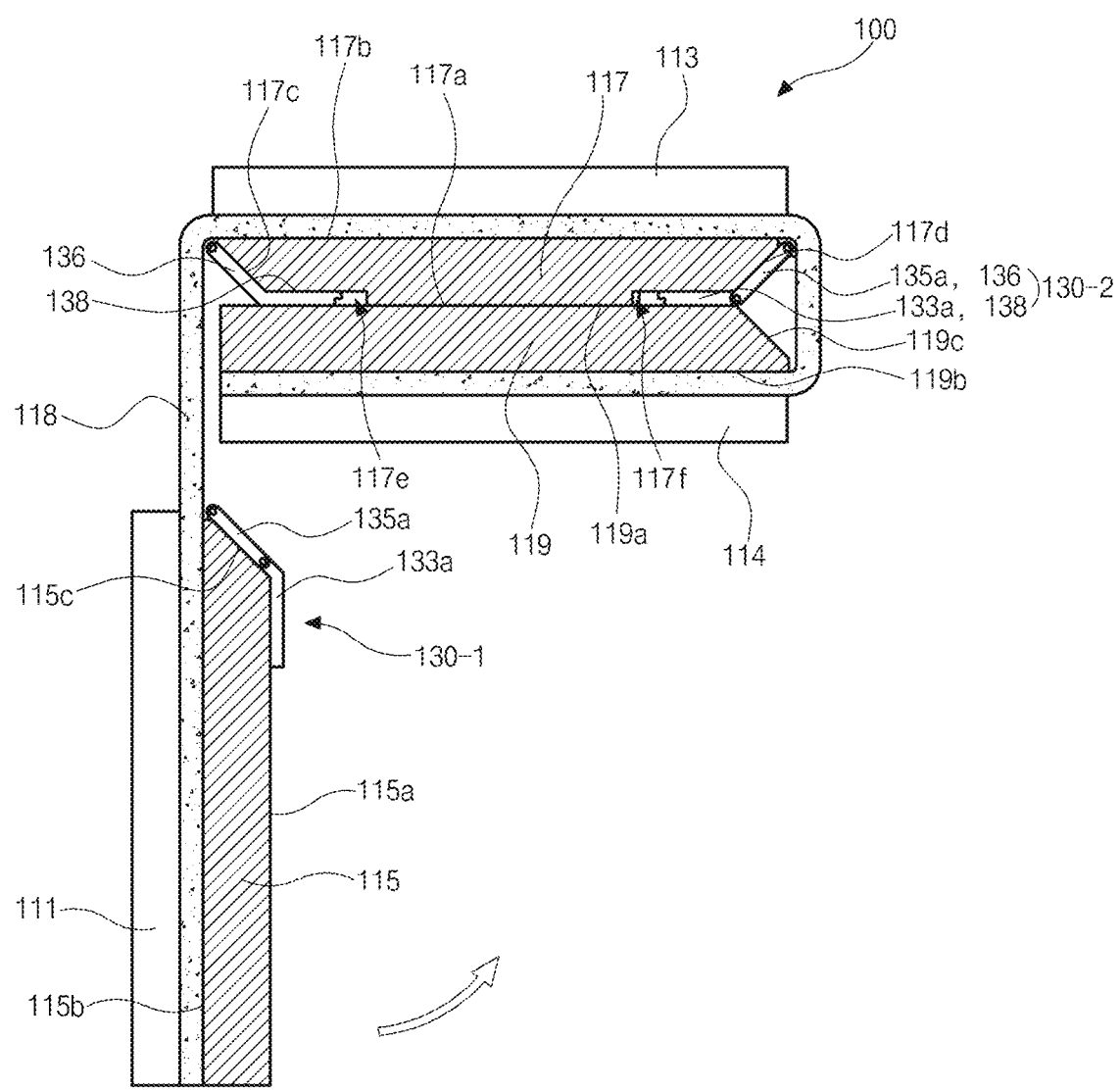

Next, as shown in FIG. 7D, the first display panel 111 and the first system unit 115 are rotated counterclockwise defined in the figure, and in this case, the first hinge portion 130a and the second hinge portion 130b of the first hinge system 130-1 are separated from each other.

That is, in the first hinge system 130-1, the first fixing protrusion 134 of FIG. 6B provided at each of the both side surfaces of the first edge of the first plate 136 of the second hinge portion 130b is separated from the first fixing hole 132a of FIG. 6B provided at the one end of each of the fourth and fifth plate bars 135a and 135b through the guide groove 132b of FIG. 6B.

At this time, the elastic plate 118 is maintained to be stretched.

Figure 7E:
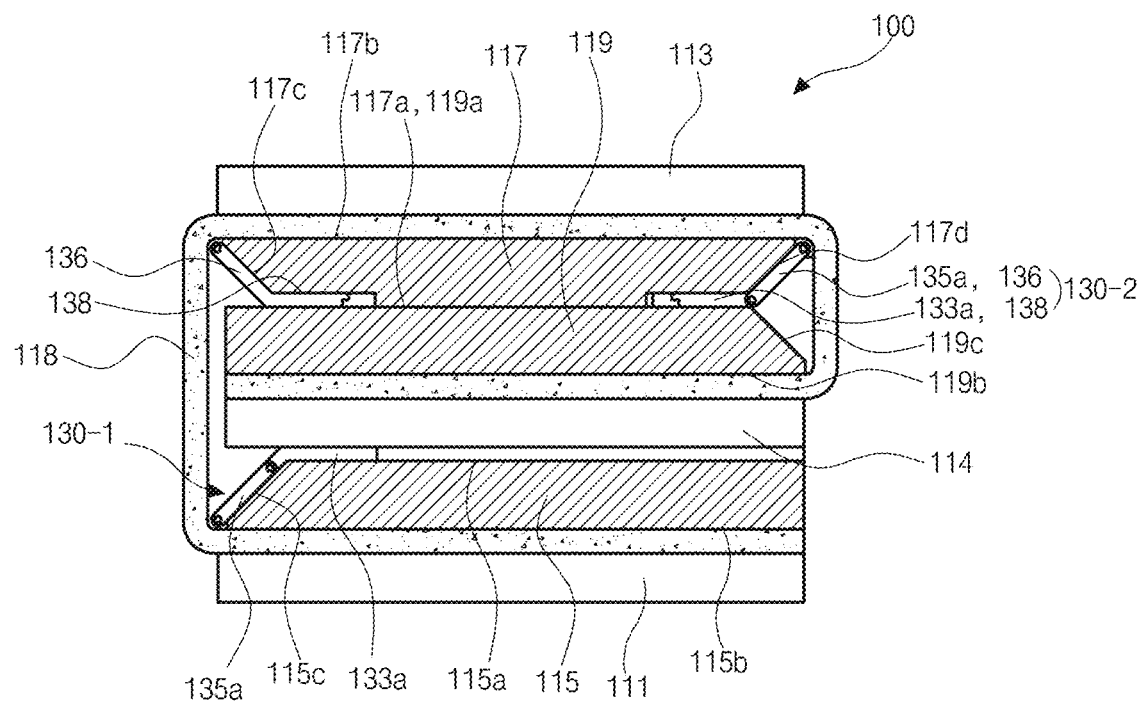

Then, as shown in FIG. 7E, the first display panel 111 and the first system unit 115 are further rotated counterclockwise defined in the figure, the rear surface 115a of the first system unit 115 is in close contact with the third display panel 114 of the third system unit 119, so that the foldable display device 100 according to the second embodiment of the present disclosure can achieve the folding state.

Accordingly, the first display panel 111 and the second display panel 113 implement images toward opposite directions.

That is, in the foldable display device 100 according to the second embodiment of the present disclosure, the first system unit 115 and the second system unit 117 are in the out-folding state.

In this case, the second plate 138 of the first hinge system 130-1 is completely disposed between the first, second and third plate bars 131, 133a and 133b. The second plate 138 and the first, second and third plate bars 131, 133a and 133b form a plane with each other, that is, are on the same plane and are disposed in close contact with the third display panel 114.

Here, the elastic plate 118 is further stretched to surround the one side surface 117c of the second system unit 117 and another side surface of the third system unit 119 and the one side surface 115c of the first system unit 115.

The foldable display device 100 according to the second embodiment of the present disclosure can be easily supported in the folding state and the unfolding state by disposing the elastic plate 118 and the first, second and third system units 115, 117 and 119 under the first, second and third display panels 111, 113 and 114 and rotatably connecting the first, second and third system units 115, 117 and 119 through the first and second hinge systems 130-1 and 130-2.

Specially, the structure of the first and second hinge systems 130-1 and 130-2, which supports the foldable display device 100 to be enabled in the folding state and the unfolding state, is simple, and the foldable display device 100 of the light weight and thin profile that has been recently required can be achieved. In addition, the process cost can be reduced, and the efficiency of the process can be improved.

Further, even though the first and second hinge systems 130-1 and 130-2 are exposed to the outside in the folding state, in the foldable display device 100 according to the second embodiment of the present disclosure, the first and second hinge systems 130-1 and 130-2 can be protected by the elastic plate 118 by disposing the elastic plate 118 between the first, second and third system units 115, 117 and 119 and the first, second and third display panels 111, 113 and 114.

Accordingly, it is possible to provide the foldable display device 100 with the improved durability against the impacts from the outside in the folding state.

FIGS. 8A to 8D are cross-sectional views schematically illustrating the operation of the foldable display device in another folding state and unfolding state in accordance with the operation of the hinge system according to the second embodiment of the present disclosure.

Figure 8A:
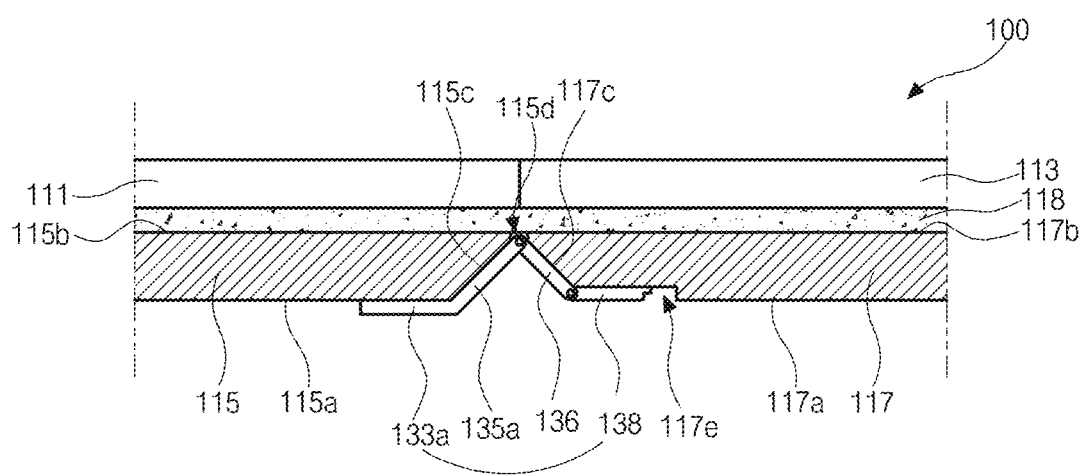
FIGS. 8A to 8D are cross-sectional views schematically illustrating the operation of the foldable display device in another folding state and unfolding state in accordance with the operation of the hinge system according to the second embodiment of the present disclosure.

As shown in FIG. 8A, the elastic plate 118 is disposed on the first and second system units 115 and 117, which are connected in series, the first display panel 111 is disposed on the elastic plate 118 to correspond to the first system unit 115, and the second display panel 113 is disposed on the elastic plate 118 to correspond to the second system unit 117.

Further, the hinge system 130 is disposed on the rear surfaces of the first and second system units 115 and 117. The first, second and third plate bars 131, 133a and 133b of the first hinge portion 130a of the hinge system 130 is in close contact with and fixed to the rear surface 115a of the first system unit 115, and the fourth and fifth plate bars 135a and 135b of the first hinge portion 130a is in close contact with and fixed to the side surface 115c of the first system unit 115.

In addition, the second plate 138 of the second hinge portion 130b of is in close contact with and fixed to the rear surface 117a of the second system unit 117, and the first plate 136 is in close contact with and fixed to the side surface 117c of the second system unit 117.

Figure 8B:
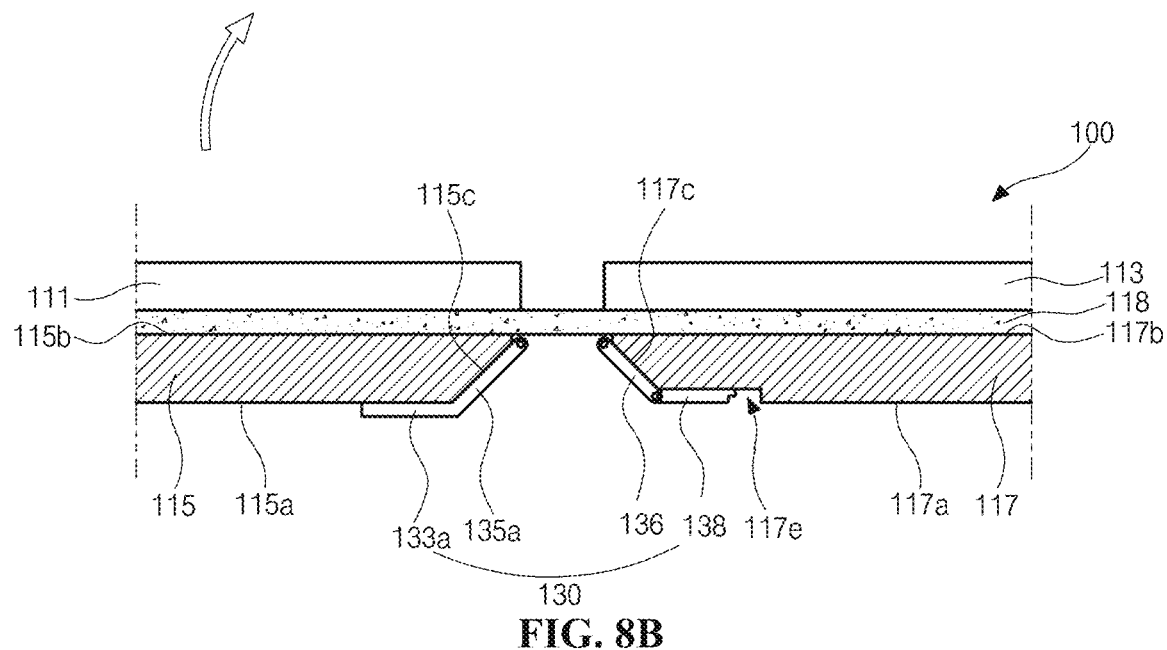

At this time, as shown in FIG. 8B, the first hinge portion 130a and the second hinge portion 130b of the hinge system 130 are separated from each other, thereby separating the first system unit 115 and the second system unit 117. That is, in the hinge system 130, the first fixing protrusion 134 of FIG. 6B provided at each of the both side surfaces of the first edge of the first plate 136 of the second hinge portion 130b is separated from the first fixing hole 132a of FIG. 6B provided at the one end of each of the fourth and fifth plate bars 135a and 135b through the guide groove 132b of FIG. 6B.

Figure 8C:
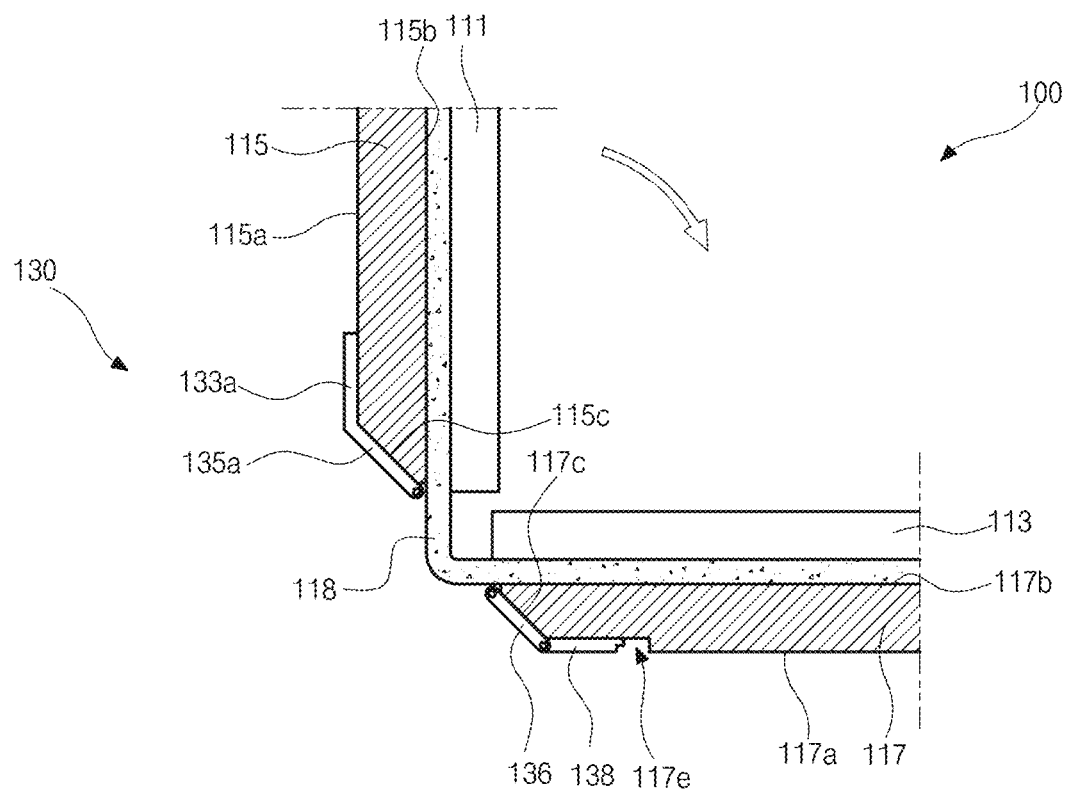

Then, as shown in FIG. 8C, the first system unit 115 is rotated clockwise defined in the figure.

In this case, the elastic plate 118 disposed between the first and second system units 115 and 117 and the first and second display panels 111 and 113 is partially stretched through the predetermined elastic modulus, so that a part of the elastic plate 118 is exposed to the outside between the first and second display panels 111 and 113.

Figure 8D:
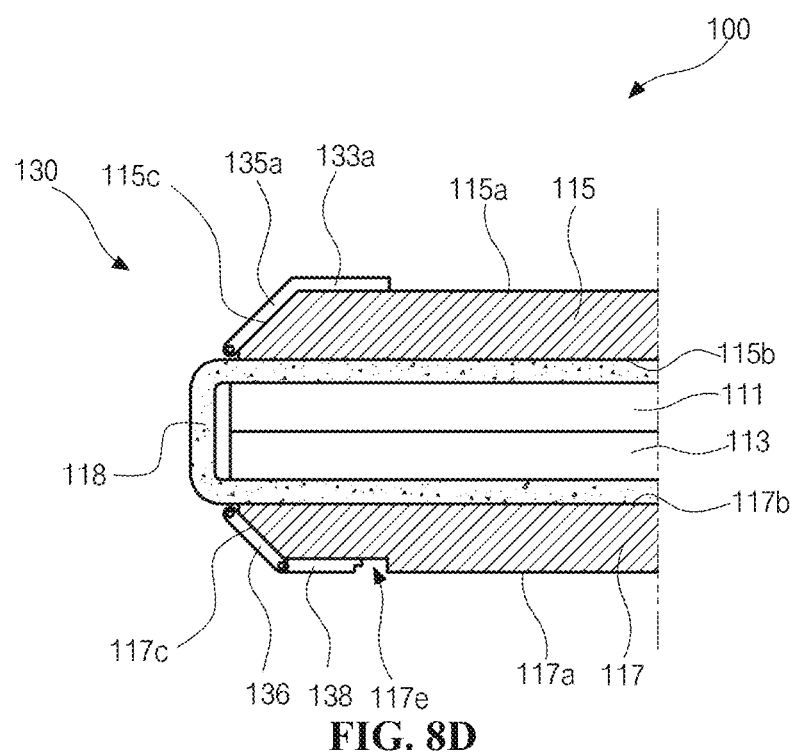

Next, as shown in FIG. 8D, the first display panel 111 and the first system unit 115 are further rotated clockwise defined in the figure, and the first display panel 111 of the first system unit 115 is in close contact with the second display panel 113 of the second system unit 117, so that the foldable display device 100 according to the second embodiment of the present disclosure can achieve the folding state.

Accordingly, in the foldable display device 100 according to the second embodiment of the present disclosure, the first system unit 115 and the second system unit 117 are in the in-folding state.

Here, the hinge system 130 according to the second embodiment of the present disclosure enables the first and second hinge portions 130a and 130b to be rotatably hinge-combined with each other and to be easily separated from each other by the pressure applied from the outside, so that the hinge system 130 according to the second embodiment of the present disclosure can allow the foldable display device 100 to be freely operated in the out-folding and in-folding states.

Meanwhile, in the embodiments, it has been described as an example that the first and second display panels 111 and 113 are disposed on the first and second system units 115 and 117, respectively, but a flexible display panel may be disposed on the first and second system units 115 and 117.

As described above, there is an effect that the foldable display device according to the present disclosure can be easily supported in the folding state and the unfolding state by disposing the elastic plate and the first and second system units under the first and second display panels and enabling the first and second system units to be rotatably connected to each other through the hinge system.

Specially, the structure of the hinge system, which supports the foldable display device to be enabled in the folding state and the unfolding state, is simple, and the foldable display device of the light weight and thin profile that has been recently required can be achieved. In addition, the process cost can be reduced, and the efficiency of the process can be improved.

In addition, by disposing the elastic plate between the first and second system units and the first and second display panels, the elastic plate can protect the hinge system, and there is an effect that it is possible to provide the foldable display device with the improved durability against the impacts from the outside in the folding state.

It will be apparent to those skilled in the art that various modifications and variations can be made in the foldable display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A foldable display device, comprising:
a display panel including first and second display areas and a folding part between the first and second display areas;
first and second system units disposed under the display panel and corresponding to the first and second display areas, respectively;
an elastic plate between the display panel and the first and second system units; and
a hinge system corresponding to the folding part and disposed on rear surfaces of the first and second system units, the hinge system including a first hinge portion on the rear surface of the first system unit and a second hinge portion on the rear surface of the second system unit,
wherein the first and second hinge portions are rotatably hinge-combined with each other,
wherein the first hinge portion includes a plurality of plate bars and the second hinge portion includes a plurality of plates such that the first hinge portion and the second hinge portion are asymmetric to each other, and
wherein the first hinge portion includes first, second, third, fourth, and fifth plate bars, and the second, third, fourth, and fifth plate bars extend perpendicularly to the first plate bar.

2. A foldable display device, comprising:
a display panel including first and second display areas and a folding part between the first and second display areas;
first and second system units disposed under the display panel and corresponding to the first and second display areas, respectively;
an elastic plate between the display panel and the first and second system units; and
a hinge system corresponding to the folding part and disposed on rear surfaces of the first and second system units, the hinge system including a first hinge portion on the rear surface of the first system unit and a second hinge portion on the rear surface of the second system unit,
wherein the first and second hinge portions are rotatably hinge-combined with each other,
wherein the first hinge portion includes a plurality of plate bars and the second hinge portion includes a plurality of plates such that the first hinge portion and the second hinge portion are asymmetric to each other,
wherein the first hinge portion includes a first plate bar being in close contact with the rear surface of the first system unit, second and third plate bars perpendicularly extending from both ends of the first plate bar, and fourth and fifth plate bars being in close contact with a side surface of the first system unit and extending upward at a predetermined angle from the second and third plate bars, respectively, and
wherein the second hinge portion includes a first plate being in close contact with a side surface of the second system unit facing the side surface of the first system unit and a second plate being in close contact with the rear surface of the second system unit.

3. The foldable display device of claim 2, wherein the first plate is rotatably hinge-combined from the fourth and fifth plate bars, and
wherein the second plate is rotatably hinge-combined from the first plate.

4. The foldable display device of claim 3, wherein a first fixing hole is provided at one end of each of the fourth and fifth plate bars, and a first fixing protrusion is provided at each of both side surfaces of a first edge of the first plate and is put and inserted into the first fixing hole.

5. The foldable display device of claim 4, wherein a fixing holder is provided at each of both side surface of a second edge of the first plate, and a second fixing hole is provided in the fixing holder, and
wherein a second fixing protrusion is provided at each of both side surfaces of a first edge of the second plate and is put and inserted into the second fixing hole.

6. The foldable display device of claim 3, wherein a first fixing hole is provided at one end of each of the fourth and fifth plate bars, and a guide groove is provided in the first fixing hole,
wherein a first fixing protrusion is provided at each of both side surfaces of a first edge of the first plate and is put and inserted into the first fixing hole, and
wherein the first fixing protrusion is formed of a magnet, and the first fixing protrusion is attached to the first fixing hole through magnetism.

7. The foldable display device of claim 6, wherein a fixing holder is provided at each of both side surface of a second edge of the first plate, and a second fixing hole is provided in the fixing holder, and
wherein a second fixing protrusion is provided at each of both side surfaces of a first edge of the second plate and is put and inserted into the second fixing hole.

8. The foldable display device of claim 3, wherein the second plate is rotatable to be disposed between the first, second and third plate bars, and
wherein the first plate is rotatable to be disposed between the fourth and fifth plate bars.

9. The foldable display device of claim 8, wherein a stepped end is provided at the first plate bar, and
wherein a protruding end is provided at the second plate and is interlocked with the stepped end.

10. The foldable display device of claim 3, wherein an indentation in which the first and second plates are placed is provided on the rear surface of the second system unit, and
wherein when the display panel is in a folding state in which images of the first and second display areas are displayed toward opposite directions, the first, second, third, fourth and fifth plate bars are placed in the indentation with the first and second plates.

11. The foldable display device of claim 3, wherein when the display panel is in a folding state in which images of the first and second display areas are displayed toward opposite directions, the elastic plate is stretched and disposed outward the hinge system.

12. The foldable display device of claim 6, wherein the first fixing protrusion is separated from the first fixing hole through the guide groove, so that the first hinge portion and the second hinge portion are separated from each other.

13. The foldable display device of claim 12, further comprising a third system unit at one side of the second system unit,
wherein the display panel further includes a third display area, and the third system unit corresponds to the third display area,
wherein the third system unit is rotatable toward the second system unit such that the rear surface of the second system unit and a rear surface of the third system unit face each other, and
wherein the first system unit is rotatable toward the second system unit such that the third display area and the rear surface of the first system unit face each other.

14. The foldable display device of claim 12, wherein the first system unit and the second system unit are spaced apart from each other with a predetermined distance and are in an out-folding state in which the rear surfaces of the first and second system units face each other, or
wherein the first system unit and the second system unit are in an in-folding state in which the rear surfaces of the first and second system units face opposite directions.

15. The foldable display device of claim 1, wherein the display panel includes first and second display panel including the first and second display areas, respectively.

16. The foldable display device of claim 1, wherein the display panel is flexible.

17. The foldable display device of claim 1, wherein the second and third plate bars are parallel to each other, and the fourth and fifth plate bars are parallel to each other.

18. The foldable display device of claim 17, wherein the second hinge portion includes first and second plates, and
wherein the first plate has a first width corresponding to a first distance between the fourth and fifth plate bars and a second width corresponding to a length of each of the fourth and fifth plate bars, and the second plate has a third width corresponding to a second distance between the second and third plate bars and a fourth width corresponding to a length of each of the second and third plate bars.

* * * * *